US010862540B1

(12) United States Patent
Osborn et al.

(10) Patent No.: US 10,862,540 B1
(45) Date of Patent: Dec. 8, 2020

(54) METHOD FOR MAPPING NFC FIELD STRENGTH AND LOCATION ON MOBILE DEVICES

(71) Applicant: Capital One Services, LLC, McLean, VA (US)

(72) Inventors: Kevin Osborn, Newton, MA (US); David Wurmfeld, Falls Church, VA (US)

(73) Assignee: Capital One Services, LLC, McLean, VA (US)

( * ) Notice: Subject to any disclaimer, the term of this patent is extended or adjusted under 35 U.S.C. 154(b) by 0 days.

(21) Appl. No.: 16/725,600

(22) Filed: Dec. 23, 2019

(51) Int. Cl.
H04B 5/00 (2006.01)
G06K 7/10 (2006.01)
G01R 33/10 (2006.01)

(52) U.S. Cl.
CPC .......... *H04B 5/0043* (2013.01); *G01R 33/10* (2013.01); *G06K 7/10336* (2013.01); *G06K 7/10386* (2013.01); *H04B 5/0031* (2013.01)

(58) Field of Classification Search
CPC combination set(s) only.
See application file for complete search history.

(56) References Cited

U.S. PATENT DOCUMENTS

| | | | |
|---|---|---|---|
| 4,683,553 A | 7/1987 | Mollier | |
| 4,827,113 A | 5/1989 | Rikuna | |
| 4,910,773 A | 3/1990 | Hazard et al. | |
| 5,036,461 A | 7/1991 | Elliott et al. | |
| 5,363,448 A | 11/1994 | Koopman, Jr. et al. | |
| 5,377,270 A | 12/1994 | Koopman, Jr. et al. | |
| 5,533,126 A | 7/1996 | Hazard | |
| 5,537,314 A | 7/1996 | Kanter | |
| 5,592,553 A | 1/1997 | Guski et al. | |
| 5,616,901 A | 4/1997 | Crandall | |
| 5,666,415 A | 9/1997 | Kaufman | |

(Continued)

FOREIGN PATENT DOCUMENTS

| | | |
|---|---|---|
| CA | 3010336 A1 | 7/2017 |
| CN | 101192295 A | 6/2008 |

(Continued)

OTHER PUBLICATIONS

Batina, L. and Poll, E., "SmartCards and RFID", Course PowerPoint Presentation for IPA Security Course, Digital Security at University of Nijmegen, Netherlands (date unknown) 75 pages.

(Continued)

*Primary Examiner* — Quochien B Vuong

(57) ABSTRACT

Various embodiments are directed to a method and system for mapping or visualizing the magnetic fields and their associated field strengths of an object, such as a mobile computing device. An example source of the magnetic fields may be a near-field communication (NFC) reader configured in the object. A computer vision system or device may track a visual marker arranged near or on a magnetic field strength detector in order to associate, match, or map the magnetic field strength measurement readings of the detector at different positions or locations on the object. The computer vision system may generate and display a heat map of the object based on at least the magnetic field strength measurements and their relative positions.

18 Claims, 8 Drawing Sheets

(56) References Cited

U.S. PATENT DOCUMENTS

| | | |
|---|---|---|
| 5,763,373 A | 6/1998 | Robinson et al. |
| 5,764,789 A | 6/1998 | Pare, Jr. et al. |
| 5,768,373 A | 6/1998 | Lohstroh et al. |
| 5,778,072 A | 7/1998 | Samar |
| 5,796,827 A | 8/1998 | Coppersmith et al. |
| 5,832,090 A | 11/1998 | Raspotnik |
| 5,883,810 A | 3/1999 | Franklin et al. |
| 5,901,874 A | 5/1999 | Deters |
| 5,929,413 A | 7/1999 | Gardner |
| 5,960,411 A | 9/1999 | Hartman et al. |
| 6,021,203 A | 2/2000 | Douceur et al. |
| 6,049,328 A | 4/2000 | Vanderheiden |
| 6,058,373 A | 5/2000 | Blinn et al. |
| 6,061,666 A | 5/2000 | Do et al. |
| 6,105,013 A | 8/2000 | Curry et al. |
| 6,199,114 B1 | 3/2001 | White et al. |
| 6,199,762 B1 | 3/2001 | Hohle |
| 6,216,227 B1 | 4/2001 | Goldstein et al. |
| 6,227,447 B1 | 5/2001 | Campisano |
| 6,282,522 B1 | 8/2001 | Davis et al. |
| 6,324,271 B1 | 11/2001 | Sawyer et al. |
| 6,342,844 B1 | 1/2002 | Rozin |
| 6,367,011 B1 | 4/2002 | Lee et al. |
| 6,402,028 B1 | 6/2002 | Graham, Jr. et al. |
| 6,438,550 B1 | 8/2002 | Doyle et al. |
| 6,501,847 B2 | 12/2002 | Helot et al. |
| 6,631,197 B1 | 10/2003 | Taenzer |
| 6,641,050 B2 | 11/2003 | Kelley et al. |
| 6,655,585 B2 | 12/2003 | Shinn |
| 6,662,020 B1 | 12/2003 | Aaro et al. |
| 6,721,706 B1 | 4/2004 | Strubbe et al. |
| 6,731,778 B1 | 5/2004 | Oda et al. |
| 6,779,115 B1 | 8/2004 | Naim |
| 6,792,533 B2 | 9/2004 | Jablon |
| 6,829,711 B1 | 12/2004 | Kwok et al. |
| 6,834,271 B1 | 12/2004 | Hodgson et al. |
| 6,834,795 B1 | 12/2004 | Rasmussen et al. |
| 6,852,031 B1 | 2/2005 | Rowe |
| 6,865,547 B1 | 3/2005 | Brake, Jr. et al. |
| 6,873,260 B2 | 3/2005 | Lancos et al. |
| 6,877,656 B1 | 4/2005 | Jaros et al. |
| 6,889,198 B2 | 5/2005 | Kawan |
| 6,905,411 B2 | 6/2005 | Nguyen et al. |
| 6,910,627 B1 | 6/2005 | Simpson-Young et al. |
| 6,971,031 B2 | 11/2005 | Haala |
| 6,990,588 B1 | 1/2006 | Yasukura |
| 7,006,986 B1 | 2/2006 | Sines et al. |
| 7,085,931 B1 | 8/2006 | Smith et al. |
| 7,127,605 B1 | 10/2006 | Montgomery et al. |
| 7,128,274 B2 | 10/2006 | Kelley et al. |
| 7,140,550 B2 | 11/2006 | Ramachandran |
| 7,152,045 B2 | 12/2006 | Hoffman |
| 7,165,727 B2 | 1/2007 | de Jong |
| 7,175,076 B1 | 2/2007 | Block et al. |
| 7,202,773 B1 | 4/2007 | Oba et al. |
| 7,206,806 B2 | 4/2007 | Pineau |
| 7,232,073 B1 | 6/2007 | de Jong |
| 7,246,752 B2 | 7/2007 | Brown |
| 7,254,569 B2 | 8/2007 | Goodman et al. |
| 7,263,507 B1 | 8/2007 | Brake, Jr. et al. |
| 7,270,276 B2 | 9/2007 | Vayssiere |
| 7,278,025 B2 | 10/2007 | Saito et al. |
| 7,287,692 B1 | 10/2007 | Patel et al. |
| 7,290,709 B2 | 11/2007 | Tsai et al. |
| 7,306,143 B2 | 12/2007 | Bonneau, Jr. et al. |
| 7,319,986 B2 | 1/2008 | Praisner et al. |
| 7,325,132 B2 | 1/2008 | Takayama et al. |
| 7,373,515 B2 | 5/2008 | Owen et al. |
| 7,374,099 B2 | 5/2008 | de Jong |
| 7,375,616 B2 | 5/2008 | Rowse et al. |
| 7,380,710 B2 | 6/2008 | Brown |
| 7,424,977 B2 | 9/2008 | Smets et al. |
| 7,453,439 B1 | 11/2008 | Kushler et al. |
| 7,472,829 B2 | 1/2009 | Brown |
| 7,487,357 B2 | 2/2009 | Smith et al. |
| 7,568,631 B2 | 8/2009 | Gibbs et al. |
| 7,584,153 B2 | 9/2009 | Brown et al. |
| 7,597,250 B2 | 10/2009 | Finn |
| 7,628,322 B2 | 12/2009 | Holtmanns et al. |
| 7,652,578 B2 | 1/2010 | Braun et al. |
| 7,689,832 B2 | 3/2010 | Talmor et al. |
| 7,703,142 B1 | 4/2010 | Wilson et al. |
| 7,748,609 B2 | 7/2010 | Sachdeva et al. |
| 7,748,617 B2 | 7/2010 | Gray |
| 7,748,636 B2 | 7/2010 | Finn |
| 7,762,457 B2 | 7/2010 | Bonalle et al. |
| 7,789,302 B2 | 9/2010 | Tame |
| 7,793,851 B2 | 9/2010 | Mullen |
| 7,796,013 B2 | 9/2010 | Murakami et al. |
| 7,801,799 B1 | 9/2010 | Brake, Jr. et al. |
| 7,801,829 B2 | 9/2010 | Gray et al. |
| 7,805,755 B2 | 9/2010 | Brown et al. |
| 7,809,643 B2 | 10/2010 | Phillips et al. |
| 7,827,115 B2 | 11/2010 | Weller et al. |
| 7,828,214 B2 | 11/2010 | Narendra et al. |
| 7,848,746 B2 | 12/2010 | Juels |
| 7,882,553 B2 | 2/2011 | Tuliani |
| 7,900,048 B2 | 3/2011 | Andersson |
| 7,908,216 B1 | 3/2011 | Davis et al. |
| 7,922,082 B2 | 4/2011 | Muscato |
| 7,933,589 B1 | 4/2011 | Mamdani et al. |
| 7,949,559 B2 | 5/2011 | Freiberg |
| 7,954,716 B2 | 6/2011 | Narendra et al. |
| 7,954,723 B2 | 6/2011 | Charrat |
| 7,962,369 B2 | 6/2011 | Rosenberg |
| 7,993,197 B2 | 8/2011 | Kaminkow |
| 8,005,426 B2 | 8/2011 | Huomo et al. |
| 8,010,405 B1 | 8/2011 | Bortolin et al. |
| RE42,762 E | 9/2011 | Shin et al. |
| 8,041,954 B2 | 10/2011 | Plesman |
| 8,060,012 B2 | 11/2011 | Sklovsky et al. |
| 8,074,877 B2 | 12/2011 | Mullen et al. |
| 8,082,450 B2 | 12/2011 | Frey et al. |
| 8,095,113 B2 | 1/2012 | Kean et al. |
| 8,099,332 B2 | 1/2012 | Lemay et al. |
| 8,103,249 B2 | 1/2012 | Markison |
| 8,108,687 B2 | 1/2012 | Ellis et al. |
| 8,127,143 B2 | 2/2012 | Abdallah et al. |
| 8,135,648 B2 | 3/2012 | Oram et al. |
| 8,140,010 B2 | 3/2012 | Symons et al. |
| 8,141,136 B2 | 3/2012 | Lee et al. |
| 8,150,321 B2 | 4/2012 | Winter et al. |
| 8,150,767 B2 | 4/2012 | Wankmueller |
| 8,186,602 B2 | 5/2012 | Itay et al. |
| 8,196,131 B1 | 6/2012 | von Behren et al. |
| 8,215,563 B2 | 7/2012 | Levy et al. |
| 8,224,753 B2 | 7/2012 | Atef et al. |
| 8,232,879 B2 | 7/2012 | Davis |
| 8,233,841 B2 | 7/2012 | Griffin et al. |
| 8,245,292 B2 | 8/2012 | Buer |
| 8,249,654 B1 | 8/2012 | Zhu |
| 8,266,451 B2 | 9/2012 | Leydier et al. |
| 8,285,329 B1 | 10/2012 | Zhu |
| 8,302,872 B2 | 11/2012 | Mullen |
| 8,312,519 B1 | 11/2012 | Bailey et al. |
| 8,316,237 B1 | 11/2012 | Felsher et al. |
| 8,332,272 B2 | 12/2012 | Fisher |
| 8,365,988 B1 | 2/2013 | Medina, III et al. |
| 8,369,960 B2 | 2/2013 | Tran et al. |
| 8,371,501 B1 | 2/2013 | Hopkins |
| 8,381,307 B2 | 2/2013 | Cimino |
| 8,391,719 B2 | 3/2013 | Alameh et al. |
| 8,417,231 B2 | 4/2013 | Sanding et al. |
| 8,439,271 B2 | 5/2013 | Smets et al. |
| 8,475,367 B1 | 7/2013 | Yuen et al. |
| 8,489,112 B2 | 7/2013 | Roeding et al. |
| 8,511,542 B2 | 8/2013 | Pan |
| 8,559,872 B2 | 10/2013 | Butler |
| 8,566,916 B1 | 10/2013 | Bailey et al. |
| 8,567,670 B2 | 10/2013 | Stanfield et al. |
| 8,572,386 B2 | 10/2013 | Takekawa et al. |
| 8,577,810 B1 | 11/2013 | Dalit et al. |
| 8,583,454 B2 | 11/2013 | Beraja et al. |
| 8,589,335 B2 | 11/2013 | Smith et al. |

(56) References Cited

U.S. PATENT DOCUMENTS

| | | | |
|---|---|---|---|
| 8,594,730 B2 | 11/2013 | Bona et al. |
| 8,615,468 B2 | 12/2013 | Varadarajan |
| 8,620,218 B2 | 12/2013 | Awad |
| 8,667,285 B2 | 3/2014 | Coulier et al. |
| 8,723,941 B1 | 5/2014 | Shirbabadi et al. |
| 8,726,405 B1 | 5/2014 | Bailey et al. |
| 8,740,073 B2 | 6/2014 | Vijayshankar et al. |
| 8,750,514 B2 | 6/2014 | Gallo et al. |
| 8,752,189 B2 | 6/2014 | de Jong |
| 8,794,509 B2 | 8/2014 | Bishop et al. |
| 8,799,668 B2 | 8/2014 | Cheng |
| 8,806,592 B2 | 8/2014 | Ganesan |
| 8,807,440 B1 | 8/2014 | von Behren et al. |
| 8,811,892 B2 | 8/2014 | Khan et al. |
| 8,814,039 B2 | 8/2014 | Bishop et al. |
| 8,814,052 B2 | 8/2014 | Bona et al. |
| 8,818,867 B2 | 8/2014 | Baldwin et al. |
| 8,850,538 B1 | 9/2014 | Vernon et al. |
| 8,861,733 B2 | 10/2014 | Benteo et al. |
| 8,880,027 B1 | 11/2014 | Darringer |
| 8,888,002 B2 | 11/2014 | Marshall Chesney et al. |
| 8,898,088 B2 | 11/2014 | Springer et al. |
| 8,934,837 B2 | 1/2015 | Zhu et al. |
| 8,977,569 B2 | 3/2015 | Rao |
| 8,994,498 B2 | 3/2015 | Agrafioti et al. |
| 9,004,365 B2 | 4/2015 | Bona et al. |
| 9,038,894 B2 | 5/2015 | Khalid |
| 9,042,814 B2 | 5/2015 | Royston et al. |
| 9,047,531 B2 | 6/2015 | Showering et al. |
| 9,069,976 B2 | 6/2015 | Toole et al. |
| 9,081,948 B2 | 7/2015 | Magne |
| 9,104,853 B2 | 8/2015 | Venkataramani et al. |
| 9,118,663 B1 | 8/2015 | Bailey et al. |
| 9,122,964 B2 | 9/2015 | Krawczewicz |
| 9,129,280 B2 | 9/2015 | Bona et al. |
| 9,152,832 B2 | 10/2015 | Royston et al. |
| 9,203,800 B2 | 12/2015 | Izu et al. |
| 9,209,867 B2 | 12/2015 | Royston |
| 9,251,330 B2 | 2/2016 | Boivie et al. |
| 9,251,518 B2 | 2/2016 | Levin et al. |
| 9,258,715 B2 | 2/2016 | Borghei |
| 9,270,337 B2 | 2/2016 | Zhu et al. |
| 9,306,626 B2 | 4/2016 | Hall et al. |
| 9,306,942 B1 | 4/2016 | Bailey et al. |
| 9,324,066 B2 | 4/2016 | Archer et al. |
| 9,324,067 B2 | 4/2016 | Van Os et al. |
| 9,332,587 B2 | 5/2016 | Salahshoor |
| 9,338,622 B2 | 5/2016 | Bjontegard |
| 9,373,141 B1 | 6/2016 | Shakkarwar |
| 9,379,841 B2 | 6/2016 | Fine et al. |
| 9,413,430 B2 | 8/2016 | Royston et al. |
| 9,413,768 B1 | 8/2016 | Gregg et al. |
| 9,420,496 B1 | 8/2016 | Indurkar |
| 9,426,132 B1 | 8/2016 | Alikhani |
| 9,432,339 B1 | 8/2016 | Bowness |
| 9,455,968 B1 | 9/2016 | Machani et al. |
| 9,473,509 B2 | 10/2016 | Arsanjani et al. |
| 9,491,626 B2 | 11/2016 | Sharma et al. |
| 9,553,637 B2 | 1/2017 | Yang et al. |
| 9,619,952 B1 | 4/2017 | Zhao et al. |
| 9,635,000 B1 | 4/2017 | Muftic |
| 9,665,858 B1 | 5/2017 | Kumar |
| 9,674,705 B2 | 6/2017 | Rose et al. |
| 9,679,286 B2 | 6/2017 | Colnot et al. |
| 9,680,942 B2 | 6/2017 | Dimmick |
| 9,697,393 B2 * | 7/2017 | Stagg ................. G06K 7/10405 |
| 9,710,804 B2 | 7/2017 | Zhou et al. |
| 9,740,342 B2 | 8/2017 | Paulsen et al. |
| 9,740,988 B1 | 8/2017 | Levin et al. |
| 9,763,097 B2 | 9/2017 | Robinson et al. |
| 9,767,329 B2 | 9/2017 | Forster |
| 9,769,662 B1 | 9/2017 | Queru |
| 9,773,151 B2 | 9/2017 | Mil'shtein et al. |
| 9,780,953 B2 | 10/2017 | Gaddam et al. |
| 9,789,483 B2 * | 10/2017 | Khattak ............ B01L 3/502715 |
| 9,891,823 B2 | 2/2018 | Feng et al. |
| 9,940,571 B1 | 4/2018 | Herrington |
| 9,953,323 B2 | 4/2018 | Candelore et al. |
| 9,961,194 B1 | 5/2018 | Wiechman et al. |
| 9,965,756 B2 | 5/2018 | Davis et al. |
| 9,965,911 B2 | 5/2018 | Wishne |
| 9,978,058 B2 | 5/2018 | Wurmfeld et al. |
| 10,043,164 B2 | 8/2018 | Dogin et al. |
| 10,075,437 B1 | 9/2018 | Costigan et al. |
| 10,129,648 B1 | 11/2018 | Hernandez et al. |
| 10,133,979 B1 | 11/2018 | Eidam et al. |
| 10,217,105 B1 | 2/2019 | Sangi et al. |
| 10,295,616 B2 * | 5/2019 | Goodson ................. G01R 33/10 |
| 10,403,113 B1 * | 9/2019 | Antar ..................... G08B 21/02 |
| 10,455,633 B2 * | 10/2019 | Maguire ............... H04W 76/14 |
| 2001/0010723 A1 | 8/2001 | Pinkas |
| 2001/0029485 A1 | 10/2001 | Brody et al. |
| 2001/0034702 A1 | 10/2001 | Mockett et al. |
| 2001/0054003 A1 | 12/2001 | Chien et al. |
| 2002/0078345 A1 | 6/2002 | Sandhu et al. |
| 2002/0093530 A1 | 7/2002 | Krothapalli et al. |
| 2002/0100808 A1 | 8/2002 | Norwood et al. |
| 2002/0120583 A1 | 8/2002 | Keresman, III et al. |
| 2002/0152116 A1 | 10/2002 | Yan et al. |
| 2002/0153424 A1 | 10/2002 | Li |
| 2002/0165827 A1 | 11/2002 | Gien et al. |
| 2003/0023554 A1 | 1/2003 | Yap et al. |
| 2003/0034873 A1 | 2/2003 | Chase et al. |
| 2003/0055727 A1 | 3/2003 | Walker et al. |
| 2003/0078882 A1 | 4/2003 | Sukeda et al. |
| 2003/0167350 A1 | 9/2003 | Davis et al. |
| 2003/0208449 A1 | 11/2003 | Diao |
| 2004/0015958 A1 | 1/2004 | Veil et al. |
| 2004/0039919 A1 | 2/2004 | Takayama et al. |
| 2004/0127256 A1 | 7/2004 | Goldthwaite et al. |
| 2004/0215674 A1 | 10/2004 | Odinak et al. |
| 2004/0230799 A1 | 11/2004 | Davis |
| 2005/0044367 A1 | 2/2005 | Gasparini et al. |
| 2005/0075985 A1 | 4/2005 | Cartmell |
| 2005/0081038 A1 | 4/2005 | Arditti Modiano et al. |
| 2005/0138387 A1 | 6/2005 | Lam et al. |
| 2005/0156026 A1 | 7/2005 | Ghosh et al. |
| 2005/0160049 A1 | 7/2005 | Lundholm |
| 2005/0195975 A1 | 9/2005 | Kawakita |
| 2005/0247797 A1 | 11/2005 | Ramachandran |
| 2006/0006230 A1 | 1/2006 | Bear et al. |
| 2006/0040726 A1 | 2/2006 | Szrek et al. |
| 2006/0041402 A1 | 2/2006 | Baker |
| 2006/0044153 A1 | 3/2006 | Dawidowsky |
| 2006/0047954 A1 | 3/2006 | Sachdeva et al. |
| 2006/0085848 A1 | 4/2006 | Aissi et al. |
| 2006/0136334 A1 | 6/2006 | Atkinson et al. |
| 2006/0173985 A1 | 8/2006 | Moore |
| 2006/0174331 A1 | 8/2006 | Schuetz |
| 2006/0242698 A1 | 10/2006 | Inskeep et al. |
| 2006/0280338 A1 | 12/2006 | Rabb |
| 2007/0033642 A1 | 2/2007 | Ganesan et al. |
| 2007/0055630 A1 | 3/2007 | Gauthier et al. |
| 2007/0061266 A1 | 3/2007 | Moore et al. |
| 2007/0061487 A1 | 3/2007 | Moore et al. |
| 2007/0116292 A1 | 5/2007 | Kurita et al. |
| 2007/0118745 A1 | 5/2007 | Buer |
| 2007/0197261 A1 | 8/2007 | Humbel |
| 2007/0224969 A1 | 9/2007 | Rao |
| 2007/0241182 A1 | 10/2007 | Buer |
| 2007/0256134 A1 | 11/2007 | Lehtonen et al. |
| 2007/0258594 A1 | 11/2007 | Sandhu et al. |
| 2007/0278291 A1 | 12/2007 | Rans et al. |
| 2008/0008315 A1 | 1/2008 | Fontana et al. |
| 2008/0011831 A1 | 1/2008 | Bonalle et al. |
| 2008/0014867 A1 | 1/2008 | Finn |
| 2008/0035738 A1 | 2/2008 | Mullen |
| 2008/0071681 A1 | 3/2008 | Khalid |
| 2008/0072303 A1 | 3/2008 | Syed |
| 2008/0086767 A1 | 4/2008 | Kulkarni et al. |
| 2008/0103968 A1 | 5/2008 | Bies et al. |
| 2008/0109309 A1 | 5/2008 | Landau et al. |
| 2008/0110983 A1 | 5/2008 | Ashfield |
| 2008/0120711 A1 | 5/2008 | Dispensa |

(56) References Cited

U.S. PATENT DOCUMENTS

| | | |
|---|---|---|
| 2008/0156873 A1 | 7/2008 | Wilhelm et al. |
| 2008/0162312 A1 | 7/2008 | Sklovsky et al. |
| 2008/0164308 A1 | 7/2008 | Aaron et al. |
| 2008/0207307 A1 | 8/2008 | Cunningham, II et al. |
| 2008/0209543 A1 | 8/2008 | Aaron |
| 2008/0223918 A1 | 9/2008 | Williams et al. |
| 2008/0285746 A1 | 11/2008 | Landrock et al. |
| 2008/0308641 A1 | 12/2008 | Finn |
| 2009/0037275 A1 | 2/2009 | Pollio |
| 2009/0048026 A1 | 2/2009 | French |
| 2009/0132417 A1 | 5/2009 | Scipioni et al. |
| 2009/0143104 A1 | 6/2009 | Loh et al. |
| 2009/0171682 A1 | 7/2009 | Dixon et al. |
| 2009/0210308 A1 | 8/2009 | Toomer et al. |
| 2009/0235339 A1 | 9/2009 | Mennes et al. |
| 2009/0249077 A1 | 10/2009 | Gargaro et al. |
| 2009/0282264 A1 | 11/2009 | Ameil et al. |
| 2010/0023449 A1 | 1/2010 | Skowronek et al. |
| 2010/0023455 A1 | 1/2010 | Dispensa et al. |
| 2010/0029202 A1 | 2/2010 | Jolivet et al. |
| 2010/0033310 A1 | 2/2010 | Narendra et al. |
| 2010/0036769 A1 | 2/2010 | Winters et al. |
| 2010/0078471 A1 | 4/2010 | Lin et al. |
| 2010/0082491 A1 | 4/2010 | Rosenblatt et al. |
| 2010/0094754 A1 | 4/2010 | Bertran et al. |
| 2010/0095130 A1 | 4/2010 | Bertran et al. |
| 2010/0100480 A1 | 4/2010 | Altman et al. |
| 2010/0114731 A1 | 5/2010 | Kingston et al. |
| 2010/0192230 A1 | 7/2010 | Steeves et al. |
| 2010/0207742 A1 | 8/2010 | Buhot et al. |
| 2010/0211797 A1 | 8/2010 | Westerveld et al. |
| 2010/0240413 A1 | 9/2010 | He et al. |
| 2010/0257357 A1 | 10/2010 | McClain |
| 2010/0312634 A1 | 12/2010 | Cervenka |
| 2010/0312635 A1 | 12/2010 | Cervenka |
| 2011/0028160 A1 | 2/2011 | Roeding et al. |
| 2011/0035604 A1 | 2/2011 | Habraken |
| 2011/0060631 A1 | 3/2011 | Grossman et al. |
| 2011/0068170 A1 | 3/2011 | Lehman |
| 2011/0084132 A1 | 4/2011 | Tofighbakhsh |
| 2011/0101093 A1 | 5/2011 | Ehrensvard |
| 2011/0113245 A1 | 5/2011 | Varadarajan |
| 2011/0125638 A1 | 5/2011 | Davis et al. |
| 2011/0131415 A1 | 6/2011 | Schneider |
| 2011/0153437 A1 | 6/2011 | Archer et al. |
| 2011/0153496 A1 | 6/2011 | Royyuru |
| 2011/0208658 A1 | 8/2011 | Makhotin |
| 2011/0208965 A1 | 8/2011 | Machani |
| 2011/0211219 A1 | 9/2011 | Bradley et al. |
| 2011/0218911 A1 | 9/2011 | Spodak |
| 2011/0238564 A1 | 9/2011 | Lim et al. |
| 2011/0246780 A1 | 10/2011 | Yeap et al. |
| 2011/0258452 A1 | 10/2011 | Coulier et al. |
| 2011/0280406 A1 | 11/2011 | Ma et al. |
| 2011/0282785 A1 | 11/2011 | Chin |
| 2011/0294418 A1 | 12/2011 | Chen |
| 2011/0312271 A1 | 12/2011 | Ma et al. |
| 2012/0024947 A1 | 2/2012 | Naelon |
| 2012/0030047 A1 | 2/2012 | Fuentes et al. |
| 2012/0030121 A1 | 2/2012 | Grellier |
| 2012/0047071 A1 | 2/2012 | Mullen et al. |
| 2012/0079281 A1 | 3/2012 | Lowenstein et al. |
| 2012/0109735 A1 | 5/2012 | Krawczewicz et al. |
| 2012/0109764 A1 | 5/2012 | Martin et al. |
| 2012/0143754 A1 | 6/2012 | Patel |
| 2012/0150737 A1 | 6/2012 | Rottink et al. |
| 2012/0178366 A1 | 7/2012 | Levy et al. |
| 2012/0196583 A1 | 8/2012 | Kindo |
| 2012/0207305 A1 | 8/2012 | Gallo et al. |
| 2012/0209773 A1 | 8/2012 | Ranganathan |
| 2012/0238206 A1 | 9/2012 | Singh et al. |
| 2012/0239560 A1 | 9/2012 | Pourfallah et al. |
| 2012/0252350 A1 | 10/2012 | Steinmetz et al. |
| 2012/0254394 A1 | 10/2012 | Barras |
| 2012/0284194 A1 | 11/2012 | Liu et al. |
| 2012/0290472 A1 | 11/2012 | Mullen et al. |
| 2012/0296818 A1 | 11/2012 | Nuzzi et al. |
| 2012/0316992 A1 | 12/2012 | Oborne |
| 2012/0317035 A1 | 12/2012 | Royyuru et al. |
| 2012/0317628 A1 | 12/2012 | Yeager |
| 2013/0005245 A1 | 1/2013 | Royston |
| 2013/0008956 A1 | 1/2013 | Ashfield |
| 2013/0026229 A1 | 1/2013 | Jarman et al. |
| 2013/0048713 A1 | 2/2013 | Pan |
| 2013/0054474 A1 | 2/2013 | Yeager |
| 2013/0065564 A1 | 3/2013 | Conner et al. |
| 2013/0080228 A1 | 3/2013 | Fisher |
| 2013/0080229 A1 | 3/2013 | Fisher |
| 2013/0099587 A1 | 4/2013 | Lou et al. |
| 2013/0104251 A1 | 4/2013 | Moore et al. |
| 2013/0106576 A1 | 5/2013 | Hinman et al. |
| 2013/0119130 A1 | 5/2013 | Braams |
| 2013/0130614 A1 | 5/2013 | Busch-Sorensen |
| 2013/0144793 A1 | 6/2013 | Royston |
| 2013/0171929 A1 | 7/2013 | Adams et al. |
| 2013/0179351 A1 | 7/2013 | Wallner |
| 2013/0185772 A1 | 7/2013 | Jaudon et al. |
| 2013/0191279 A1 | 7/2013 | Calman et al. |
| 2013/0200999 A1 | 8/2013 | Spodak et al. |
| 2013/0216108 A1 | 8/2013 | Hwang et al. |
| 2013/0226791 A1 | 8/2013 | Springer et al. |
| 2013/0226796 A1 | 8/2013 | Jiang et al. |
| 2013/0232082 A1 | 9/2013 | Krawczewicz et al. |
| 2013/0238894 A1 | 9/2013 | Ferg et al. |
| 2013/0282360 A1 | 10/2013 | Shimota et al. |
| 2013/0303085 A1 | 11/2013 | Boucher et al. |
| 2013/0304651 A1 | 11/2013 | Smith |
| 2013/0312082 A1 | 11/2013 | Izu et al. |
| 2013/0314593 A1 | 11/2013 | Reznik et al. |
| 2013/0344857 A1 | 12/2013 | Berionne et al. |
| 2014/0002238 A1 | 1/2014 | Taveau et al. |
| 2014/0019352 A1 | 1/2014 | Shrivastava |
| 2014/0027506 A1 | 1/2014 | Heo et al. |
| 2014/0032409 A1 | 1/2014 | Rosano |
| 2014/0032410 A1 | 1/2014 | Georgiev et al. |
| 2014/0040120 A1 | 2/2014 | Cho et al. |
| 2014/0040139 A1 | 2/2014 | Brudnicki et al. |
| 2014/0040147 A1 | 2/2014 | Varadarakan et al. |
| 2014/0047235 A1 | 2/2014 | Lessiak et al. |
| 2014/0067690 A1 | 3/2014 | Pitroda et al. |
| 2014/0074637 A1 | 3/2014 | Hammad |
| 2014/0074655 A1 | 3/2014 | Lim et al. |
| 2014/0081720 A1 | 3/2014 | Wu |
| 2014/0138435 A1 | 5/2014 | Khalid |
| 2014/0171034 A1 | 6/2014 | Aleksin et al. |
| 2014/0171039 A1 | 6/2014 | Bjontegard |
| 2014/0172700 A1 | 6/2014 | Teuwen et al. |
| 2014/0180851 A1 | 6/2014 | Fisher |
| 2014/0208112 A1 | 7/2014 | McDonald et al. |
| 2014/0214674 A1 | 7/2014 | Narula |
| 2014/0229375 A1 | 8/2014 | Zaytzsev et al. |
| 2014/0245391 A1 | 8/2014 | Adenuga |
| 2014/0256251 A1 | 9/2014 | Caceres et al. |
| 2014/0258099 A1 | 9/2014 | Rosano |
| 2014/0258113 A1 | 9/2014 | Gauthier et al. |
| 2014/0258125 A1 | 9/2014 | Gerber et al. |
| 2014/0274179 A1 | 9/2014 | Zhu et al. |
| 2014/0279479 A1 | 9/2014 | Maniar et al. |
| 2014/0337235 A1 | 11/2014 | Van Heerden et al. |
| 2014/0339315 A1 | 11/2014 | Ko |
| 2014/0346860 A1 | 11/2014 | Aubry et al. |
| 2014/0365780 A1 | 12/2014 | Movassaghi |
| 2014/0379361 A1 | 12/2014 | Mahadkar et al. |
| 2015/0012444 A1 | 1/2015 | Brown et al. |
| 2015/0032635 A1 | 1/2015 | Guise |
| 2015/0071486 A1 | 3/2015 | Rhoads et al. |
| 2015/0088757 A1 | 3/2015 | Zhou et al. |
| 2015/0089586 A1 | 3/2015 | Ballesteros |
| 2015/0134452 A1 | 5/2015 | Williams |
| 2015/0140960 A1 | 5/2015 | Powell et al. |
| 2015/0154595 A1 | 6/2015 | Collinge et al. |
| 2015/0170138 A1 | 6/2015 | Rao |
| 2015/0178724 A1 | 6/2015 | Ngo et al. |
| 2015/0186871 A1 | 7/2015 | Laracey |

(56) References Cited

U.S. PATENT DOCUMENTS

| | | |
|---|---|---|
| 2015/0205379 A1 | 7/2015 | Mag et al. |
| 2015/0302409 A1 | 10/2015 | Malek et al. |
| 2015/0317626 A1 | 11/2015 | Ran et al. |
| 2015/0332266 A1 | 11/2015 | Friedlander et al. |
| 2015/0339474 A1 | 11/2015 | Paz et al. |
| 2015/0371234 A1 | 12/2015 | Huang et al. |
| 2016/0012465 A1 | 1/2016 | Sharp |
| 2016/0026997 A1 | 1/2016 | Tsui et al. |
| 2016/0048913 A1 | 2/2016 | Rausaria et al. |
| 2016/0055480 A1 | 2/2016 | Shah |
| 2016/0057619 A1 | 2/2016 | Lopez |
| 2016/0065370 A1 | 3/2016 | Le Saint et al. |
| 2016/0087957 A1 | 3/2016 | Shah et al. |
| 2016/0092696 A1 | 3/2016 | Guglani et al. |
| 2016/0148193 A1 | 5/2016 | Kelley et al. |
| 2016/0232523 A1 | 8/2016 | Venot et al. |
| 2016/0239672 A1 | 8/2016 | Khan et al. |
| 2016/0253651 A1 | 9/2016 | Park et al. |
| 2016/0255072 A1 | 9/2016 | Liu |
| 2016/0267486 A1 | 9/2016 | Mitra et al. |
| 2016/0277383 A1 | 9/2016 | Guyomarc'h et al. |
| 2016/0277388 A1 | 9/2016 | Lowe et al. |
| 2016/0307187 A1 | 10/2016 | Guo et al. |
| 2016/0307189 A1 | 10/2016 | Zarakas et al. |
| 2016/0314472 A1 | 10/2016 | Ashfield |
| 2016/0330027 A1 | 11/2016 | Ebrahimi |
| 2016/0335531 A1 | 11/2016 | Mullen et al. |
| 2016/0379217 A1 | 12/2016 | Hammad |
| 2017/0004502 A1 | 1/2017 | Quentin et al. |
| 2017/0011395 A1 | 1/2017 | Pillai et al. |
| 2017/0011406 A1 | 1/2017 | Tunnell et al. |
| 2017/0017957 A1 | 1/2017 | Radu |
| 2017/0017964 A1 | 1/2017 | Janefalkar et al. |
| 2017/0024716 A1 | 1/2017 | Jiam et al. |
| 2017/0039566 A1 | 2/2017 | Schipperheijn |
| 2017/0041759 A1 | 2/2017 | Gantert et al. |
| 2017/0068950 A1 | 3/2017 | Kwon |
| 2017/0103388 A1 | 4/2017 | Pillai et al. |
| 2017/0104739 A1 | 4/2017 | Lansler et al. |
| 2017/0109509 A1 | 4/2017 | Baghdasaryan |
| 2017/0109730 A1 | 4/2017 | Locke et al. |
| 2017/0116447 A1 | 4/2017 | Cimino et al. |
| 2017/0124568 A1 | 5/2017 | Moghadam |
| 2017/0140379 A1 | 5/2017 | Deck |
| 2017/0154328 A1 | 6/2017 | Zarakas et al. |
| 2017/0154333 A1 | 6/2017 | Gleeson et al. |
| 2017/0180134 A1 | 6/2017 | King |
| 2017/0230189 A1 | 8/2017 | Toll et al. |
| 2017/0237301 A1 | 8/2017 | Elad et al. |
| 2017/0289127 A1 | 10/2017 | Hendrick |
| 2017/0295013 A1 | 10/2017 | Claes |
| 2017/0316696 A1 | 11/2017 | Bartel |
| 2017/0317834 A1 | 11/2017 | Smith et al. |
| 2017/0330173 A1 | 11/2017 | Woo et al. |
| 2017/0374070 A1 | 12/2017 | Shah et al. |
| 2018/0034507 A1 | 2/2018 | Wobak et al. |
| 2018/0039986 A1 | 2/2018 | Essebag et al. |
| 2018/0068316 A1 | 3/2018 | Essebag et al. |
| 2018/0129945 A1 | 5/2018 | Saxena et al. |
| 2018/0160255 A1 | 6/2018 | Park |
| 2018/0191501 A1 | 7/2018 | Lindemann |
| 2018/0205712 A1 | 7/2018 | Versteeg et al. |
| 2018/0240106 A1 | 8/2018 | Garrett et al. |
| 2018/0254909 A1 | 9/2018 | Hancock |
| 2018/0268132 A1 | 9/2018 | Buer et al. |
| 2018/0270214 A1 | 9/2018 | Caterino et al. |
| 2018/0294959 A1 | 10/2018 | Traynor et al. |
| 2018/0300716 A1 | 10/2018 | Carlson |
| 2018/0302396 A1 | 10/2018 | Camenisch et al. |
| 2018/0315050 A1 | 11/2018 | Hammad |
| 2018/0316666 A1 | 11/2018 | Koved et al. |
| 2018/0322486 A1 | 11/2018 | Deliwala et al. |
| 2018/0359100 A1 | 12/2018 | Gaddam et al. |
| 2019/0014107 A1 | 1/2019 | George |
| 2019/0019375 A1 | 1/2019 | Foley |
| 2019/0036678 A1 | 1/2019 | Ahmed |
| 2019/0174207 A1* | 6/2019 | Cella ............... H04L 67/12 |
| 2019/0235032 A1* | 8/2019 | Lassalle-Balier ............... G01R 33/0017 |
| 2019/0238517 A1 | 8/2019 | D'Agostino et al. |

FOREIGN PATENT DOCUMENTS

| | | |
|---|---|---|
| CN | 103023643 A | 4/2013 |
| CN | 103417202 A | 12/2013 |
| EP | 1085424 A1 | 3/2001 |
| EP | 1223565 A1 | 7/2002 |
| EP | 1265186 A2 | 12/2002 |
| EP | 1783919 A1 | 5/2007 |
| EP | 2139196 A1 | 12/2009 |
| EP | 1469419 A1 | 8/2012 |
| EP | 2852070 A1 | 3/2015 |
| GB | 2457221 A | 8/2009 |
| GB | 2516861 A | 2/2015 |
| GB | 2551907 A | 1/2018 |
| KR | 101508320 B1 | 4/2015 |
| WO | 0049586 A1 | 8/2000 |
| WO | 2006070189 A2 | 7/2006 |
| WO | 2008055170 A2 | 5/2008 |
| WO | 2009025605 A2 | 2/2009 |
| WO | 2010049252 A1 | 5/2010 |
| WO | 2011112158 A1 | 9/2011 |
| WO | 2012001624 A1 | 1/2012 |
| WO | 2013039395 A1 | 3/2013 |
| WO | 2013155562 A1 | 10/2013 |
| WO | 2013192358 A2 | 12/2013 |
| WO | 2014043278 A1 | 3/2014 |
| WO | 2014170741 A2 | 10/2014 |
| WO | 2015179649 A1 | 11/2015 |
| WO | 2015183818 A1 | 12/2015 |
| WO | 2016097718 A1 | 6/2016 |
| WO | 2016160816 A1 | 10/2016 |
| WO | 2016168394 A1 | 10/2016 |
| WO | 2017042375 A1 | 3/2017 |
| WO | 2017042400 A1 | 3/2017 |
| WO | 2017157859 A1 | 9/2017 |
| WO | 2017208063 A1 | 12/2017 |
| WO | 2018063809 A1 | 4/2018 |
| WO | 2018137888 A1 | 8/2018 |

OTHER PUBLICATIONS

Haykin, M. and Warnar, R., "Smart Card Technology: New Methods for Computer Access Control", Computer Science and Technology NIST Special Publication 500-157:1-60 (1988).

Lehpamer, H., "Component of the RFID System", RFID Design Principles, 2nd edition pp. 133-201 (2012).

Author Unknown, "CardrefresherSM from American Express®", [online] 2019 [retrieved on Mar. 25, 2019]. Retrieved from Internet URL: https://merchant-channel.americanexpress.com/merchant/en_US/cardrefresher, 2 pages.

Author Unknown, "Add Account Updater to your recurring payment tool", [online] 2018-19 [retrieved on Mar. 25, 2019]. Retrieved from Internet URL: https://www.authorize.net/our-features/account-updater/, 5 pages.

Author Unknown, "Visa® Account Updater for Merchants", [online] 2019 [retrieved on Mar. 25, 2019]. Retrieved from Internet URL: https://usa.visa.com/dam/VCOM/download/merchants/visa-account-updater-product-information-fact-sheet-for-merchants.pdf, 2 pages.

Author Unknown, "Manage the cards that you use with Apple Pay", Apple Support [online] 2019 [retrieved on Mar. 25, 2019]. Retrieved from Internet URL: https://support.apple.com/en-us/HT205583, 5 pages.

Author Unknown, "Contactless Specifications for Payment Systems", EMV Book B—Entry Point Specification [online] 2016 [retrieved on Mar. 25, 2019]. Retrieved from Internet URL: https://www.emvco.com/wp-content/uploads/2017/05/BookB_Entry_Point_Specification_v2_6_20160809023257319.pdf, 52 pages.

Author Unknown, "EMV Integrated Circuit Card Specifcations for Payment Systems, Book 2, Security and Key Management," Version

(56) References Cited

OTHER PUBLICATIONS 3.4, [online] 2011 [retrieved on Mar. 25, 2019]. Retrieved from Internet URL: https://www.emvco.com/wp-content/uploads/2017/05/EMV_v4.3_Book_2_Security_and_Key_Management_20120607061923900.pdf, 174 pages.

Author Unknown, "NFC Guide: All You Need to Know About Near Field Communication", Square Guide [online] 2018 [retrieved on Nov. 13, 2018]. Retrieved from Internet URL: https://squareup.com/guides/nfc, 8 pages.

Profis, S., "Everything you need to know about NFC and mobile payments" CNET Directory [online], 2014 [retrieved on Mar. 25, 2019]. Retrieved from the Internet URL: https://www.cnet.com/how-to/how-nfc-works-and-mobile-payments/, 6 pages.

Cozma, N., "Copy data from other devices in Android 5.0 Lollipop setup", CNET Directory [online] 2014 [retrieved on Mar. 25, 2019]. Retrieved from the Internet URL: https://www.cnet.com/how-to/copy-data-from-other-devices-in-android-5-0-lollipop-setup/, 5 pages.

Kevin, Android Enthusiast, "How to copy text string from nfc tag", StackExchange [online] 2013 [retrieved on Mar. 25, 2019]. Retrieved from the Internet URL: https://android.stackexchange.com/questions/55689/how-to-copy-text-string-from-nfc-tag, 11 pages.

Author Unknown, "Tap & Go Device Setup", Samsung [online] date unknown [retrieved on Mar. 25, 2019]. Retrieved from the Internet URL: https://www.samsung.com/us/switch-me/switch-to-the-galaxy-s-5/app/partial/setup-device/tap-go.html, 1 page.

Author Unknown, "Multiple encryption", Wikipedia [online] 2019 [retrieved on Mar. 25, 2019]. Retrieved from Internet URL: https://en.wikipedia.org/wiki/Multiple_encryption, 4 pages.

Krawczyk, et al., "HMAC: Keyed-Hashing for Message Authentication", Network Working Group RFC:2104 memo [online] 1997 [retrieved on Mar. 25, 2019]. Retrieved from Internet URL: https://tools.ietf.org/html/rfc2104, 12 pages.

Song, et al., "The AES-CMAC Algorithm", Network Working Group RFC: 4493 memo [online] 2006 [retrieved on Mar. 25, 2019]. Retrieved from Internet URL: https://tools.ietf.org/html/rfc4493, 21 pages.

Katz, J. and Lindell, Y., "Aggregate Message Authentication Codes", Topics in Cryptology [online] 2008 [retrieved on Mar. 25, 2019]. Retrieved from Internet URL: https://www.cs.umd.edu/~jkatz/papers/aggregateMAC.pdf, 11 pages.

Adams, D., and Maier, A-K., "Goldbug Big Seven open source crypto-messengers to be compared—or: Comprehensive Confidentiality Review & Audit of GoldBug Encrypting E-Mail-Client & Secure Instant Messenger", Big Seven Study 2016 [online] [retrieved on Mar. 25, 2018]. Retrieved from Internet URL: https://sf.net/projects/goldbug/files/bigseven-crypto-audit.pdf, 309 pages.

Author Unknown, "Triple DES", Wikipedia [online] 2018 [retrieved on Mar. 25, 2019]. Retrieved from Internet URL: https://simple.wikipedia.org/wiki/Triple_DES, 2 pages.

Song F., and Yun, A.I., "Quantum Security of NMAC and Related Constructions—PRF domain extension against quantum attacks", IACR Cryptology ePrint Archive [online] 2017 [retrieved on Mar. 25, 2019]. Retrieved from Internet URL: https://eprint.iacr.org/2017/509.pdf, 41 pages.

Saxena, N., "Lecture 10: NMAC, HMAC and Number Theory", CS 6903 Modern Cryptography [online] 2008 [retrieved on Mar. 25, 2019]. Retrieved from Internet URL: http://isis.poly.edu/courses/cs6903/Lectures/lecture10.pdf, 8 pages.

Berg, G., "Fundamentals of EMV", Smart Card Alliance [online] date unknown [retrieved on Mar. 27, 2019]. Retrieveed from Internet URL: https://www.securetechalliance.org/resources/media/scap13_preconference/02.pdf, 37 pages.

Pierce, K., "Is the amazon echo nfc compatible?", Amazon.com Customer Q&A [online] 2016 [retrieved on Mar. 26, 2019]. Retrieved from Internet URL: https://www.amazon.com/ask/questions/Tx1RJXYSPE6XLJD?_encodi . . . , 2 pages.

Author Unknown, "Multi-Factor Authentication", idaptive [online] 2019 [retrieved on Mar. 25, 2019]. Retrieved from Internet URL: https://www.centrify.com/products/application-services/adaptive-multi-factor-authentication/risk-based-mfa/, 10 pages.

Author Unknown, "Adaptive Authentication", SecureAuth [online] 2019 [retrieved on Mar. 25, 2019}. Retrieved from Internet URL: https://www.secureauth.com/products/access-management/adaptive-authentication, 7 pages.

Van den Breekel, J., et al., "EMV in a nutshell", Technical Report, 2016 [retrieved on Mar. 25, 2019]. Retrieved from Internet URL: https://www.cs.ru.nl/E.Poll/papers/EMVtechreport.pdf, 37 pages.

Author Unknown, "Autofill", Computer Hope [online] 2018 [retrieved on Mar. 25, 2019]. Retrieved from Internet URL: https://www.computerhope.com/jargon/a/autofill.htm, 2 pages.

Author Unknown, "Fill out forms automatically", Google Chrome Help [online] 2019 [retrieved on Mar. 25, 2019]. Retrieved from Internet URL: https://support.google.com/chrome/answer/142893?co=GENIE.Platform%3DDesktop&hl=en, 3 pages.

Author Unknown, "Autofill credit cards, contacts, and passwords in Safari on Mac", Apple Safari User Guide [online] 2019 [retrieved on Mar. 25, 2019]. Retrieved from Internet URL: https://support.apple.com/guide/safari/use-autofill-ibrw1103/mac, 3 pages.

Menghin, M.J., "Power Optimization Techniques for Near Field Communication Systems", 2014 Dissertation at Technical University of Graz [online]. Retrieved from Internet URL: https://diglib.tugraz.at/download.php?id=576a7b910d2d6&location=browse, 135 pages.

Mareli, M., et al., "Experimental evaluation of NFC reliability between an RFID tag and a smartphone", Conference paper (2013) IEEE AFRICON At Mauritius [online] [retrieved on Mar. 25, 2019]. Retrieved from Internet URL: https://core.ac.uk/download/pdf/54204839.pdf, 5 pages.

Davison, A., et al., "MonoSLAM: Real-Time Single Camera SLAM", IEEE Transactions on Pattern Analysis and Machine Intelligence 29(6): 1052-1067 (2007).

Barba, R., "Sharing your location with your bank sounds creepy, but it's also useful", Bankrate, LLC [online] 2017 [retrieved on Mar. 25, 2019]. Retrieved from Internet URL: https://www.bankrate.com/banking/banking-app-location-sharing/, 6 pages.

Author Unknown: "onetappayment™", [online] Jan. 24, 2019, [retrieved on Mar. 25, 2019]. Retrieved from Internet URL: https://www.payubiz.in/onetap, 4 pages.

Vu, et al., "Distinguishing users with capacitive touch communication", Proceedings of the Annual International Conference on Mobile Computing and Networking, 2012, MOBICOM. 10.1145/2348543.2348569.

Pourghomi, P., et al., "A Proposed NFC Payment Application," International Journal of Advanced Computer Science and Applications, 4(8):173-181 (2013).

Author unknown, "EMV Card Personalization Specification", EMVCo., LLC., specification version 1.0, (2003) 81 pages.

Ullmann et al., "On-Card User Authentication for Contactless Smart Cards based on Gesture Recognition", paper presentation LNI proceedings, (2012) 12 pages.

Faraj, S.T., et al., "Investigation of Java Smart Card Technology for Multi-Task Applications", J of Al-Anbar University for Pure Science, 2(1):23 pages (2008).

Dhamdhere, P., "Key Benefits of a Unified Platform for Loyalty, Referral Marketing, and UGC" Annex Cloud [online] May 19, 2017 [retrieved on Jul. 3, 2019]. Retrieved from Internet URL: https://www.annexcloude.com/blog/benefits-unified-platform/, 13 pages.

\* cited by examiner

US 10,862,540 B1

METHOD FOR MAPPING NFC FIELD STRENGTH AND LOCATION ON MOBILE DEVICES

BACKGROUND

Near-field communication (NFC) is a communication protocol that enables two electronic components, one of which may be a portable device such as a smartphone, to establish communication by bringing them within close proximity of each other. NFC readers or coils, however, are typically arranged in different places on different mobile devices, which results in varying NFC performance characteristics. Accordingly, there is a need to locate and visualize the most active areas of NFC readers on NFC enabled mobile device and other types of contactless readers.

SUMMARY

Various embodiments are directed to a method and system for mapping or visualizing the magnetic fields and their associated field strengths of an object, such as a mobile computing device. An example source of the magnetic fields may be a near-field communication (NFC) reader configured in the object. A computer vision system or device may track a visual marker arranged near or on a magnetic field strength detector in order to associate, match, or map the magnetic field strength measurement readings of the detector at different positions or locations on the object. The computer vision system may generate and display a heat map of the object based on at least the magnetic field strength measurements and their relative positions.

DETAILED DESCRIPTION

Figure 1:
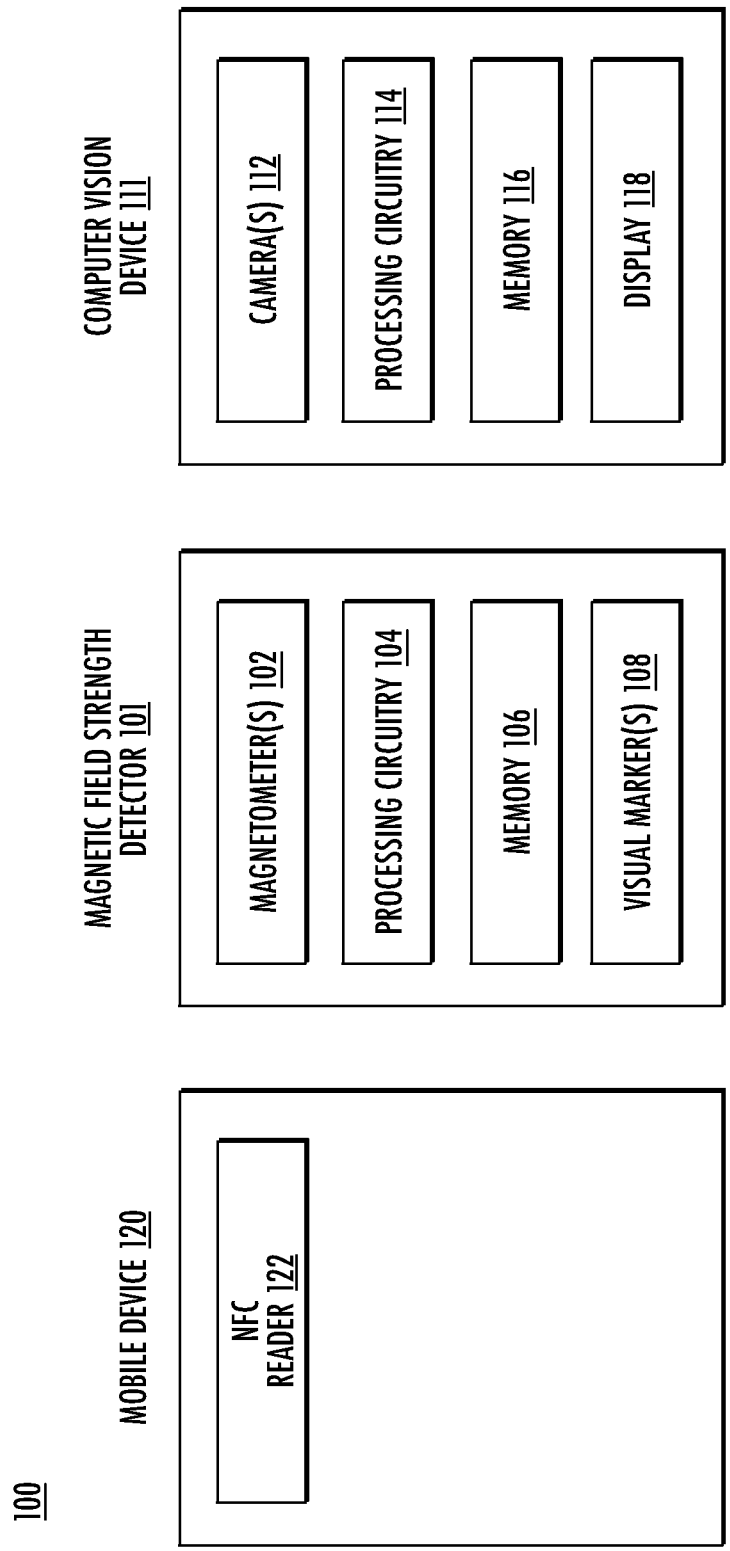
FIG. 1 illustrates an example magnetic field strength mapping system in accordance with one or more embodiments.

Various embodiments are generally directed to a method and system for measuring magnetic field strengths at various locations on a mobile computing device and visualizing or visually displaying the measured magnetic field strengths on a heat map. The term "heat map" may be understood to broadly mean a graphical representation of data, e.g., measurement intensity, in the form of a map or diagram in which different data values can be represented in different colors.

In one embodiment, a magnetic field strength detection device or detector may include at least a magnetometer. The magnetic field strength detector may detect magnetic field strengths, e.g., NFC field strengths, at various locations on a mobile computing device, such as a smartphone, laptop, tablet computer, etc., using the magnetometer. In examples, one or more visual markers may be arranged on or adjacent relative to the detector, e.g., near or on the magnetometer, which can be tracked by a computer vision system while measurements are being taken. The NFC field strength readings may be provided to the vision system, which may be used to create a heat map of the magnetic or NFC field strengths measured at the various locations on the mobile computing device. As will be further described below, the heat map may be drawn or displayed over a digital image of the mobile computing device.

In another embodiment, the magnetic field strength detector may include one or more different types of sensors, such as a hall effect sensor, a coil, etc. The one or more sensors may be used to output different voltage values at various locations on the mobile computing device based on different levels of NFC or magnetic oscillations detected by the one or more sensors. In examples, the voltage values may be used to determine respective magnetic or NFC field strength measurements at the measured locations. A computer vision system may be used to track one or more visual markers relative to the detector and produce a heat map of the magnetic field strengths.

According to embodiments, the magnetic field strength detector may be a wand-like device or otherwise may have a wand-like shape. For instance, the tip of the wand-like device may be formed by a magnetometer, a sensor, or the like, which may be coupled or connected to processing circuitry that may be housed in a handle portion of the wand-like device. In examples, one or more visual markers trackable by a computer vision system may be arranged at the tip of the wand-like device. Moreover, the magnetic field strength detector may communicate, wired or wirelessly, the measured magnetic field strength values to the computer vision system for visualization of the measured values.

In one example previous solution, a magnetic field viewing film was used to show stationary or slowly changing magnetic fields of a magnetic source. The viewing film, however, may not possess the sensitivity needed to accurately map the magnetic field strengths originating from various portions of an electronic object. The embodiments and examples described herein overcome the problems existing in previous solutions by generating accurate visualizations, e.g., heat maps, of the object that indicate at least the location, source, and strength of magnetic fields emanating from the object, such as magnetic fields from an NFC reader configured in a smartphone. Accordingly, the locations and the most active areas of magnetic field sources on or within a particular object can be quickly and accurately identified.

Reference is now made to the drawings, where like reference numerals are used to refer to like elements throughout. In the following description, for the purpose of explanation, numerous specific details are set forth in order to provide a thorough understanding thereof. It may be evident, however, that the novel embodiments can be practiced without these specific details. In other instances, well-known structures and devices are shown in block diagram form to facilitate a description thereof. The intention is to cover all modification, equivalents, and alternatives within the scope of the claims.

FIG. 1 illustrates an example magnetic field strength mapping system 100 according to embodiments. As shown, the mapping system 100 may include at least a magnetic field strength detector 101, a computer vision device 111, and a mobile device 120. The magnetic field strength detector 101 may be used to detect various magnetic field strengths at different positions on the mobile device 120, which can be visualized by the computer vision device 111 by tracking one or more visual markers on the magnetic field strength detector 101.

For example, the magnetic field strength detector 101 may include at least one or more magnetometers 102, processing circuitry 104, memory 106, and one or visual markers 108. It may be understood that a magnetometer may be any device, sensor, or hardware component that measures magnetic fields (e.g., flux density, field direction, field strength, and/or relative change(s) in the magnetic field at a particular location, etc.). The processing circuitry 104 may be any processing mechanism, e.g., hardware (central processing unit, processor, ASIC, field programmable gate array, or the like), software, etc., and along with the memory 106, may facilitate and perform processing of magnetic field measurements taken by the one or more magnetometers 102. In examples, the one or more visual markers 106 may be arranged anywhere on the detector 101 so that the computer vision device 111 may be able to "watch" and track the marker(s) 106 so as to associate a specific magnetic field measurement value with a specific measured position on the mobile device 120. As will be further described below, in some examples, a visual marker may be arranged on the magnetometer itself. Moreover, while not shown, it may be understood that the magnetic field strength detector 101 may further include interface components for allowing the detector 101 to communicate at least the measurement values with the computer vision device 111.

As further shown in FIG. 1, the computer vision device 111 may include at least one or more cameras 112, processing circuitry 114, memory 116, and a display 118. Moreover, it may be understood that the computer vision device may also include interface components for communicating with or receiving from the detector 101 magnetic field measurements or measurement values. In examples, the one or more cameras 112 may be digital, analog, visible-light cameras, or any suitable image capturing devices for acquiring image data, which can be in the form of multi-image or video sequences or in the form of multi-dimensional image data if more than one camera is implemented. The camera(s) 112 may track the one or more visual markers 108 at each specific position and determine whether there is a corresponding magnetic field strength measurement associated with that position. As will be further described below, using the processing circuitry 114 and executable programs stored in memory 116, the computer vision device 111 may visualize, map, or "draw" a heat map of the various magnetic field strength measurements over an image of the mobile device 120 (which may have also been taken by the cameras 112) based at least in part on the tracking of the visual marker(s) and the associated measurements.

The mobile device 120 may be any type of mobile computing device, such as a smartphone, a tablet computer, a wearable computer, a laptop, or the like. As illustrated, an example source of the magnetic field may be an NFC reader 122 (and other related NFC components, for example, an NFC reader coil). For example, a visualization (e.g., heat map) of the magnetic field strength measurements of the mobile device 120 by the detector 101 and the computer vision device 111 may reveal that the strongest magnetic field measurements are detected toward the top of the mobile device 120 (where the NFC reader 122 is located). Thus, advantageously, a heat map of the field strength measurements may visually indicate to a user that the "sweet spot" of the NFC reader is at the top-middle portion of the mobile device 120.

It may be understood that the illustrated magnetic field strength mapping system 100 and the components therein in FIG. 1 have been simplified for ease of explanation and are non-limiting examples. As such, there may more (or less) components than the components illustrated in the magnetic field strength detector 101, computer vision device 111, and the mobile device 120 of FIG. 1. Moreover, it may be understood that the computer vision device 111 and the components therein may be part of a computer vision system, which may include other computer vision devices and components connected over a network.

Figure 2:
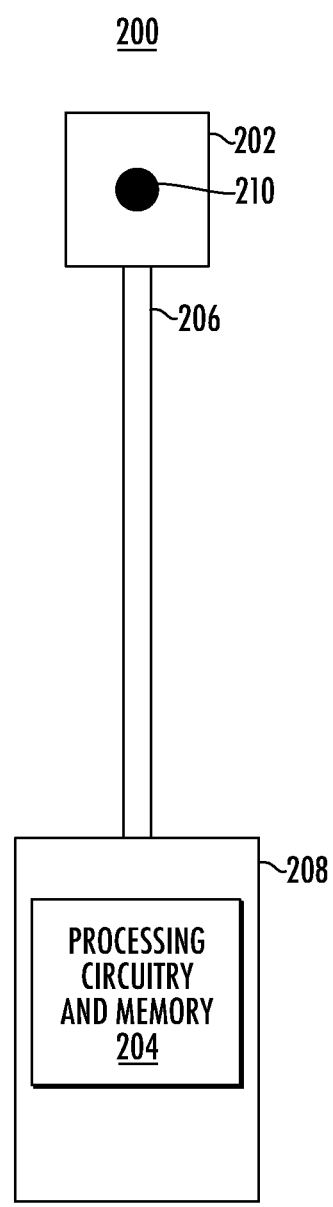
FIG. 2 illustrates an example magnetic field strength detector in accordance with one or more embodiments.

FIG. 2 illustrates an example magnetic field strength detector 200 according to embodiments. As described above, the magnetic field strength detector 200 may include at least a magnetometer 202 and processing circuitry and memory 204, which may be coupled by one or more wires 206. At least the processing circuitry and memory 204 may be arranged in a housing 208. As shown, the magnetic field strength detector 200 may generally have a wand-like shape, where the magnetometer 202 may form the tip of the wand and the housing 208 may form the handle. In examples, the wires 206 may be configured in a rigid manner (e.g., the wires themselves may be rigid, the wires may be twisted together to form a rigid structure, the wires may be encased in a rigid housing) so that the wire configuration can sufficiently hold or accommodate the weight of the magnetometer 202. In at least that regard, the wires 206 may form the general structure of the elongated body of the wand.

As further illustrated in FIG. 2, a visual marker 210 may be arranged on the magnetometer 202. The visual marker may be any type of visual aid to indicate a position, location, place, etc. as long as the marker is trackable by one or more cameras of a computer vision system or device. While the visual marker 210 arranged on the magnetometer 202 is a black circular dot, it may be understood that it may be any shape, color, colored shape, colored dot, visual pattern, and the like. For example, it may be star-shaped, triangular, or rectangular. In some examples, the visual marker may be machine-readable code that can be detected by a computer vision system for at least rendering information to the user, for instance, in augmented reality.

According to embodiments, a user may wave, hover, or scan the tip of the detector 200, e.g., the magnetometer 202, over the outer surface of a mobile device. At a first position relative to the mobile device, the magnetometer 202 may measure a first magnetic field strength. Similarly, the magnetometer 202 may measure a second magnetic field strength at a second position relative to the mobile device, may measure a third magnetic field strength at a third position, a fourth magnetic field strength at a fourth portion, and so on. The computer vision device, such as the computer vision device 111 of FIG. 1, may track the visual maker 210 when the first magnetic field strength is measured at the first position and receive the first magnetic field strength measurement from the detector 200 (not necessarily in any particular order). When the second magnetic field strength is measured at the second position, the visual marker 210 is tracked and the measurement is received by the computer vision device. The same may apply for the third position, the fourth position, etc.

In some examples, the magnetic field strength detector 200 may be configured to determine the source of the magnetic field(s) based on the signal frequencies originating from the source, and upon determination of that source, provide such information to the computer vision device. For example, if detected signal frequency is between 13 and 14 MHz, the detector 200 may determine that the signal is NFC. If the signal frequency is between 1850 and 1990 MHz, the source of such signal may be cellular.

Thereafter, the computer vision device may generate a heat map of the mobile device based on the magnetic field strength measurements (e.g., first field strength measurement, second field strength measurement, third measurement, fourth measurement). As will be described below, the heat map may visually indicate the magnetic field strengths at the respective measured locations on the mobile device and may further indicate—in color or in other ways—degrees of field strength, location relative to other measurements, type of signal being emitted from the mobile device, source of the measured fields, etc.

Figure 3:
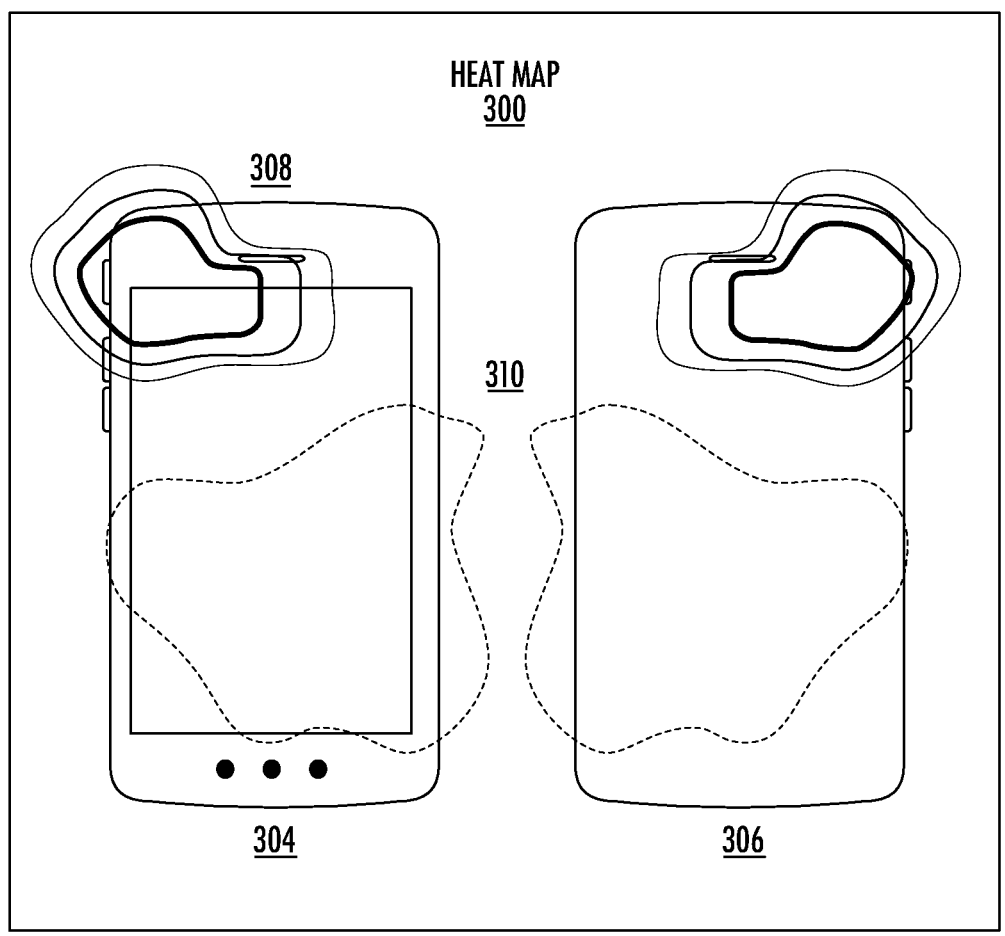
FIG. 3 illustrates an example heat map in accordance with one or more embodiments.

FIG. 3 illustrates an example heat map 300 of various magnetic fields and their respective strengths detected on a mobile device, such as a smartphone, according to embodiments. As shown, the heat map 300 may be overlaid on one or more digital images of the smartphone, such as a front image 304 and a rear image 306 of the smartphone. From the front side of the smartphone, the heat map 300 may indicate the presence of a magnetic field 308 on the top-left portion. The line representing the inner-most ring of the magnetic field 308 may be color-coded (e.g., red), or as shown, drawn thicker than the other lines to indicate that the magnetic field is the strongest in that region. As the magnetic field 308 expands outward from the inner-most portion, the field strength may be weaker, as indicated by the thinner lines representing the middle and outer-most rings (or may be color-coded in orange and yellow, respectively). Further shown is a generally large magnetic field 310, which may be very weak as indicated by dashed lines (or otherwise indicated by a color representing very weak field strength, such as blue).

From the rear side of the smartphone, the magnetic fields 308 and 310 may be indicated, represented, or displayed the same way as the front side, but flipped. It may be understood that while FIG. 3 shows both front and rear images 304 and 306 of the smartphone, in some examples, the heat map 300 may show only the front side or only the rear side, or whichever side is most relevant to the user. For example, if the detection of the source of the magnetic field 308 is stronger on the front side than the rear side, then only the front side may be displayed for the user in the heat map 300. Moreover, in some examples, the heat map 300 may also display the source of the displayed magnetic fields based on related information provided by the detector, e.g., NFC source, cellular source, etc.

As illustrated in FIG. 3, the heat map 300 indicates to the user that the source of the strongest magnetic fields is likely located at the top-left portion of the smartphone (from the front side). In some embodiments, the user may configure the heat map 300 to selectively display and color-code the source of the magnetic field. For example, the rings and lines depicting the magnetic field may be a particular color or shades of color (e.g., red) while magnetic fields corresponding to a different source may represented by a different color or shades of color (e.g., purple). Moreover, it may be understood that various graphics or images may be further overlaid or displayed on the heat map 300. For instance, the word "NFC" or an image of an NFC chip may be displayed in the center of the rings depicting the magnetic field 308.

Figure 4:
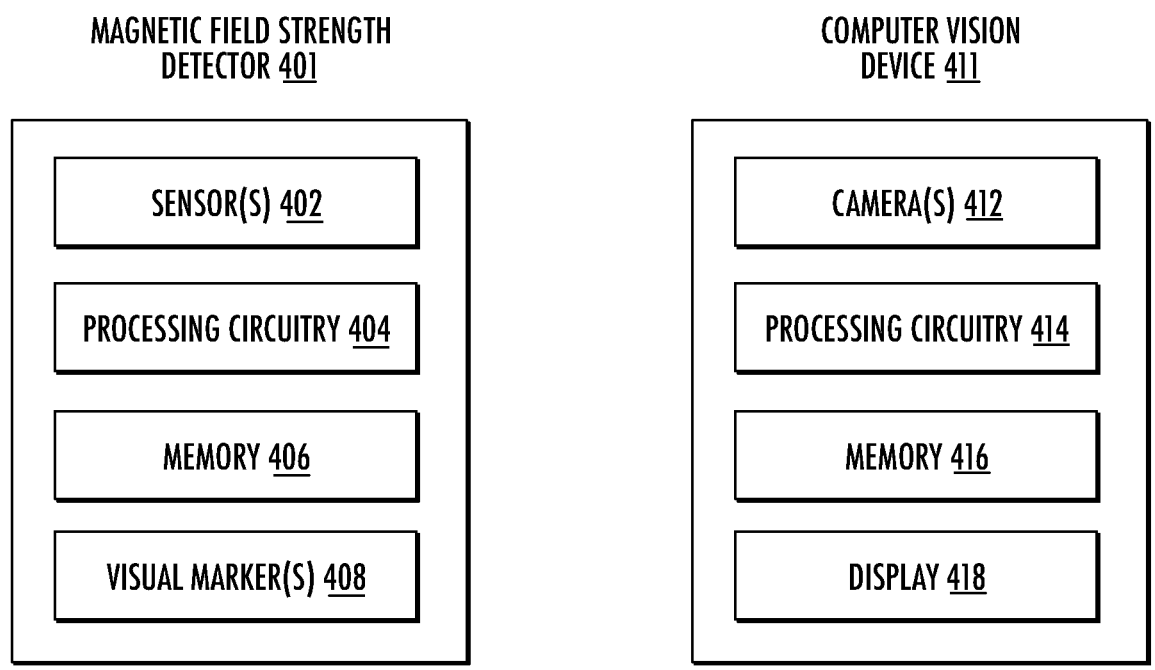
FIG. 4 illustrates another example of a magnetic field strength mapping system in accordance with one or more embodiments.

FIG. 4 illustrates an alternative example of a magnetic field strength mapping system 400 according to embodiments. As shown, the components and the setup of the mapping system 400 is similar to the magnetic field strength mapping system 100 of FIG. 1. A magnetic field strength detector 401 includes at least one or more sensor(s) 402, processing circuitry 404, memory 406, and one or more visual markers 408. Moreover, a computer vision device 411 may include one or more cameras 412, processing circuitry 414, memory 416, and display 418. In FIG. 4, however, the one or more sensors 402 used to detect magnetic field strength may be different or configured differently than the magnetometer used in the system of FIG. 1.

In one example, sensor 402 may be a hall effect sensor. It may be understood that a hall effect sensor may be a device that is used to measure the magnitude of a magnetic field by providing an output voltage that may be directly proportional to the magnetic field strength through the sensor. In another example, the sensor 402 may be a coil, which may be configured similar to the hall effect sensor. Thus, the one or more sensors of the magnetic field strength detector 401 may provide voltage values at various measurement positions or locations on a mobile device. The voltage values may be used to determine respective magnetic field strength measurements at those positions or locations. In some examples, an analog-to-digital converter may be used in conjunction with the coil sensor to measure voltage levels of analog magnetic or NFC oscillations.

Similar to the computer vision device 111 of FIG. 1, the computer vision device 411 may track the one or more visual markers 408 and receive the various magnetic field strength measurements to at least generate a heat map, as described above.

Figure 5:
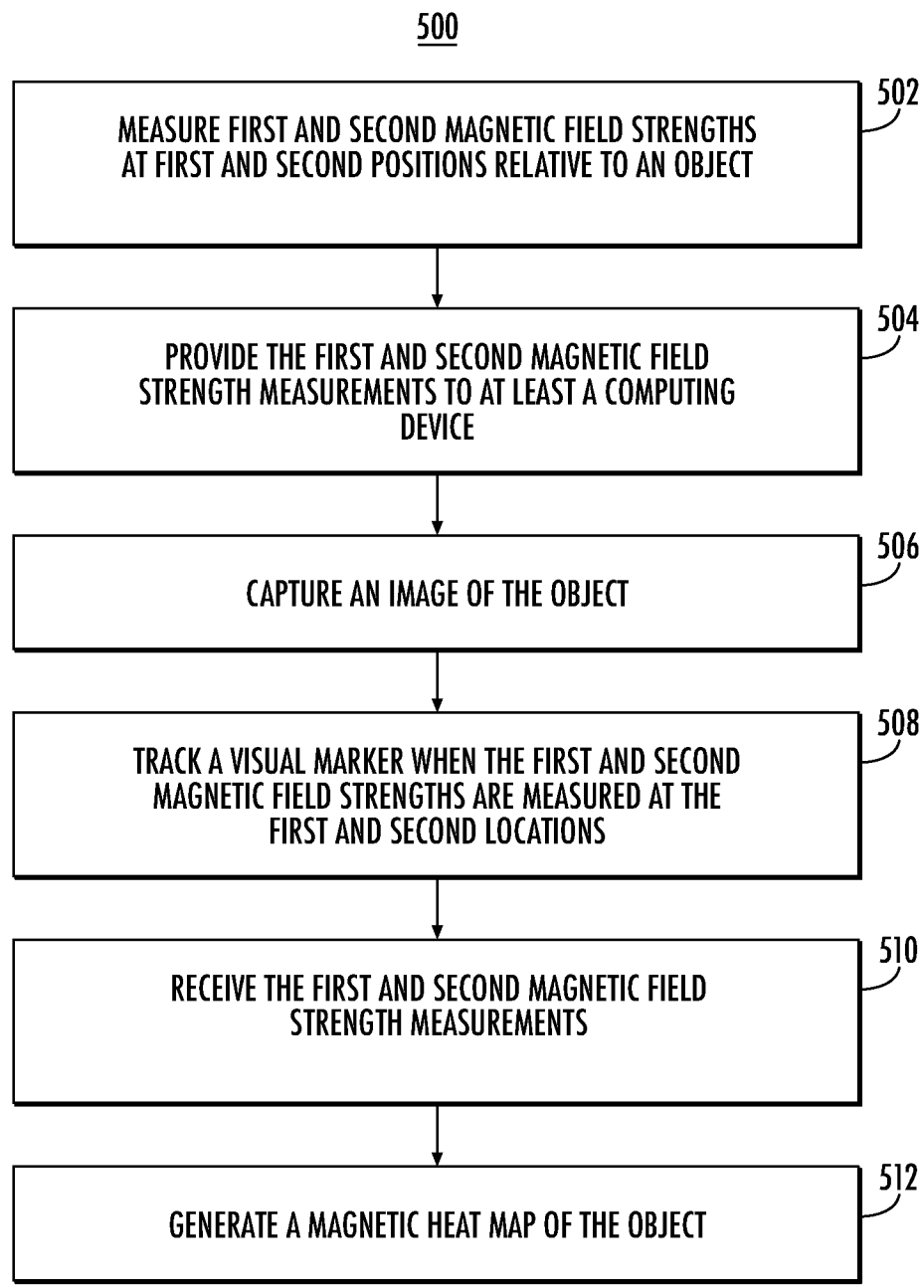
FIG. 5 illustrates an example flow diagram in accordance with one or more embodiments.

FIG. 5 illustrates an example flow diagram 500 according to one or more embodiments. For example, the flow diagram 500 describes the mapping process corresponding to the magnetic field strength mapping system of FIG. 1. It may be understood that the features associated with the illustrated blocks may be performed or executed by the processing circuitries included in a magnetic field strength detector and computer vision device, such as the ones illustrated in FIG. 1.

At block 502, a magnetic field strength detector (e.g., specifically, a magnetometer of the detector) may be used to measure magnetic field strengths at a first position and a second position relative to an object. For example, the object may be a smartphone, a laptop, a tablet computing device, a wearable computing device, or a mobile computing device. It may be understood that magnetic field strengths at a third position, a fourth position, a fifth position, and so on may also be measured, as described above.

At block 504, the first and second magnetic field strength measurements may be provided to at least one computing device. In examples, the computing device may be a computer vision device. At block 506, one or more images of the object may be captured by at least one camera of the computer vision device. As described above, the image of the object may be used so that a heat map, for example, may be overlaid thereon.

At block 508, the computer vision device may track a visual marker, which may be arranged on the magnetic field strength detector when or as the magnetic field strength measurements are being taken at the first and second locations on the object. At block 510, the first and second magnetic field strength measurements may be received by the computer vision device. Thus, in some examples, blocks 504, 508, and 510 may be performed simultaneously or near simultaneously in real-time since the processes described therein may be related.

At block 512, a magnetic heat map of the object may be generated by the computer vision device or computer vision system based at least in part on the received first and second magnetic field strength measurements. As described above, the heat map may visually indicate the first and second magnetic field strengths (and other measured magnetic field strengths) on the image of the object, which was captured at block 506. In examples, the heat map data may be overlaid on the object image. In examples, the source of the magnetic fields and their associated field strengths may be an NFC reader coil integrated in the object.

It may be understood that the blocks illustrated in FIG. 5 are not limited to any specific order. One or more of the blocks may be performed or executed simultaneously or near simultaneously.

Figure 6:
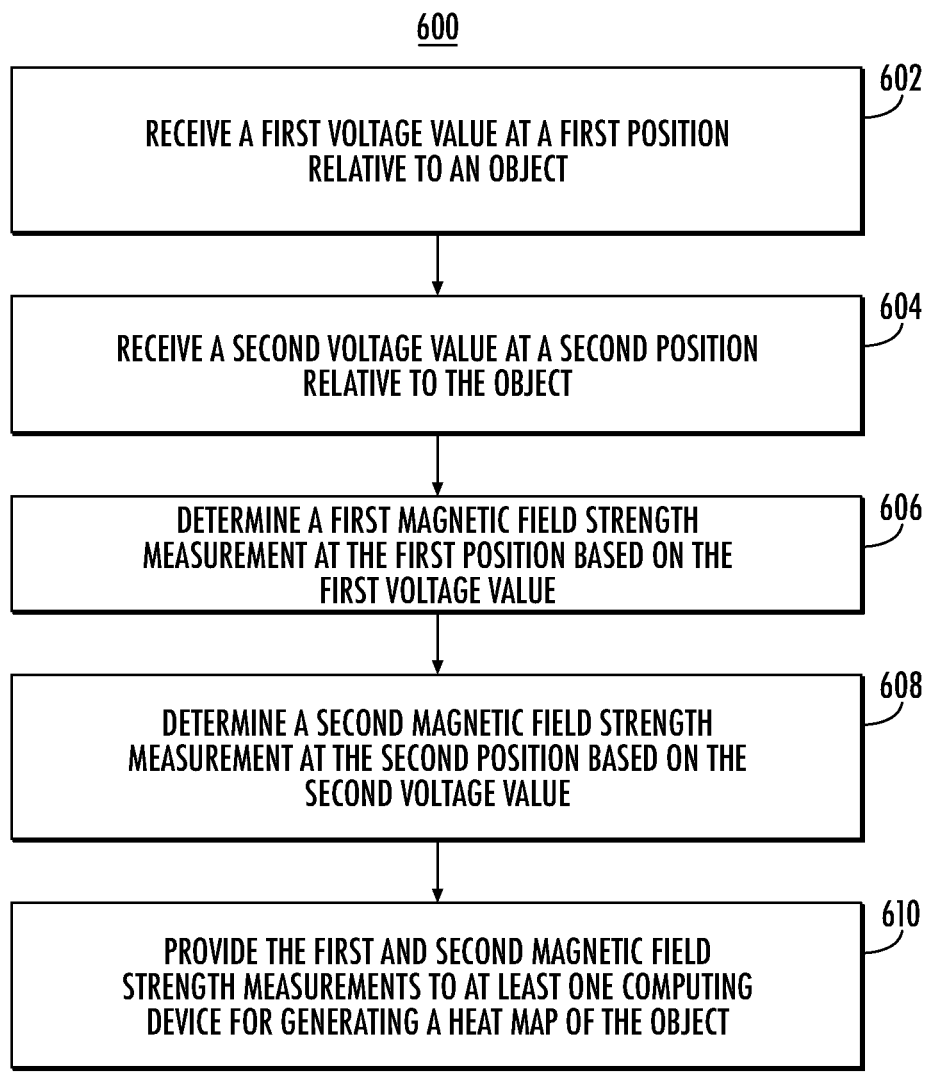
FIG. 6 illustrates another example of a flow diagram in accordance with one or more embodiments.

FIG. 6 illustrates an example flow diagram 600 according to one or more embodiments. For example, the flow diagram 600 describes the mapping process corresponding to the magnetic field strength mapping system of FIG. 4, in particular, the processes performed by the magnetic field strength detector. It may be understood that the features associated with the illustrated blocks may be performed or executed by the processing circuitries included in the magnetic field strength detector, such as the one illustrated in FIG. 4.

At block 602, processing circuitry of a magnetic field strength detector may receive, from a sensor, a first voltage value at a first position relative to an object (e.g., a smartphone, laptop, etc.). As described above, the sensor may be a hall effect sensor, or a coil sensor, configured to output a voltage value directly proportional to the magnitude of the magnetic field detected by the sensor. Similarly, at block 604, a second voltage value at a second position relative to the object may be received. Additional voltage values at a third position, a fourth position, a fifth position, and so on may also be received by the detector.

At block 606, a first magnetic field strength measurement at the first position may be determined by the processing circuitry based on the first voltage value. Thus, for instance, if the voltage value at the first position is relatively greater than other voltage values, then it can be determined that the magnitude of a magnetic field is stronger or greater at the first position compared to other locations. Moreover, at block 608, a second magnetic field strength measurement at the second position may be determined based on the second voltage value.

At block 610, the first and second magnetic field strength measurements may be provided to at least one computing device, e.g., a computer vision device, in order to generate a magnetic heat map of the object. The computer vision device, as described above, may track a visual marker arranged on the magnetic field strength detector and match the received field strength measurements to where the visual marker is tracked and located. Based at least on this process, the heat map may be generated and displayed on a display device, where, for example, the various strengths of the magnetic fields may be color-coded, differently shaded, shaped, etc.

It may be understood that the blocks illustrated in FIG. 6 are not limited to any specific order. One or more of the blocks may be performed or executed simultaneously or near simultaneously.

Figure 7:
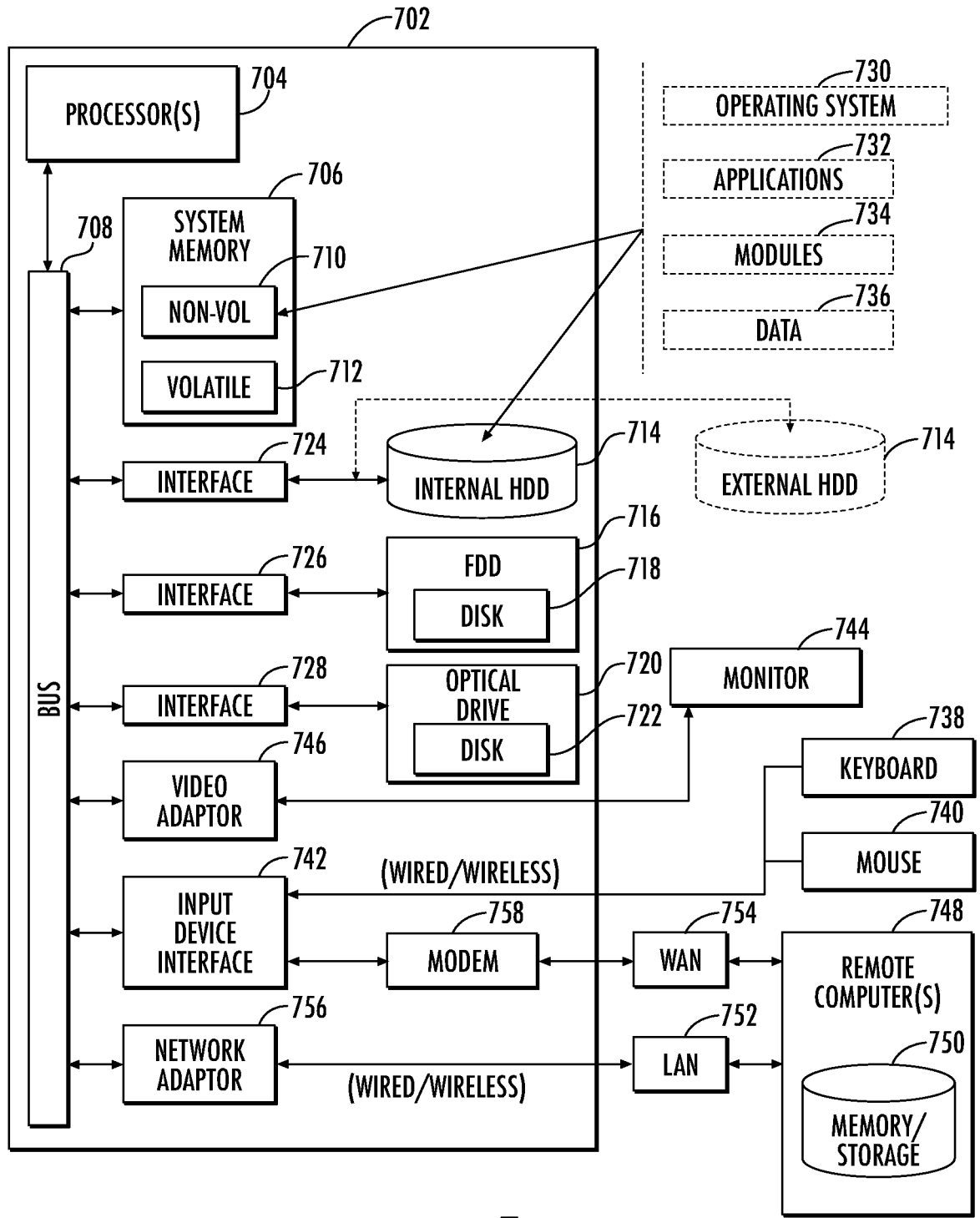
FIG. 7 illustrates an example computing architecture of a computing device in accordance with one or more embodiments.

FIG. 7 illustrates an embodiment of an exemplary computing architecture 700, e.g., of a computing device, such as a desktop computer, laptop, tablet computer, mobile computer, smartphone, etc., suitable for implementing various embodiments as previously described. In one embodiment, the computing architecture 700 may include or be implemented as part of a system, which will be further described below. In examples, one or more computing devices and the processing circuitries thereof may be configured to at least run, execute, support, or provide one or more aspects of the magnetic field strength mapping system, such as the computer vision device, and related functionalities. It may be understood that one or more components of the computing architecture 700 may also be implemented or configured in the above-described magnetic field detectors.

As used in this application, the terms "system" and "component" are intended to refer to a computer-related entity, either hardware, a combination of hardware and software, software, or software in execution, examples of which are provided by the exemplary computing architecture 700. For example, a component can be, but is not limited to being, a process running on a processor, a processor, a hard disk drive, multiple storage drives (of optical and/or magnetic storage medium), an object, an executable, a thread of execution, a program, and/or a computer. By way of illustration, both an application running on a server and the server can be a component. One or more components can reside within a process and/or thread of execution, and a component can be localized on one computer and/or distributed between two or more computers. Further, components may be communicatively coupled to each other by various types of communications media to coordinate operations. The coordination may involve the uni-directional or bi-directional exchange of information. For instance, the components may communicate information in the form of signals communicated over the communications media. The information can be implemented as signals allocated to various signal lines. In such allocations, each message is a signal. Further embodiments, however, may alternatively employ data messages. Such data messages may be sent across various connections. Exemplary connections include parallel interfaces, serial interfaces, and bus interfaces.

The computing architecture 700 includes various common computing elements, such as one or more processors, multi-core processors, co-processors, memory units, chipsets, controllers, peripherals, interfaces, oscillators, timing devices, video cards, audio cards, multimedia input/output (I/O) components, power supplies, and so forth. The embodiments, however, are not limited to implementation by the computing architecture 700.

As shown in FIG. 7, the computing architecture 700 includes processor 704, a system memory 706 and a system bus 708. The processor 704 can be any of various commercially available processors, processing circuitry, central processing unit (CPU), a dedicated processor, a field-programmable gate array (FPGA), etc.

The system bus 708 provides an interface for system components including, but not limited to, the system memory 706 to the processor 704. The system bus 708 can be any of several types of bus structure that may further interconnect to a memory bus (with or without a memory controller), a peripheral bus, and a local bus using any of a variety of commercially available bus architectures. Interface adapters may connect to the system bus 708 via slot architecture. Example slot architectures may include without limitation Accelerated Graphics Port (AGP), Card Bus, (Extended) Industry Standard Architecture ((E)ISA), Micro Channel Architecture (MCA), NuBus, Peripheral Component Interconnect (Extended) (PCI(X)), PCI Express, Personal Computer Memory Card International Association (PCMCIA), and the like.

The computing architecture 700 may include or implement various articles of manufacture. An article of manufacture may include a computer-readable storage medium to store logic. Examples of a computer-readable storage medium may include any tangible media capable of storing electronic data, including volatile memory or non-volatile memory, removable or non-removable memory, erasable or non-erasable memory, writeable or re-writeable memory, and so forth. Examples of logic may include executable computer program instructions implemented using any suitable type of code, such as source code, compiled code, interpreted code, executable code, static code, dynamic code, object-oriented code, visual code, and the like. Embodiments may also be at least partly implemented as instructions contained in or on a non-transitory computer-readable medium, which may be read and executed by one or more processors to enable performance of the operations described herein.

The system memory 706 may include various types of computer-readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, an array of devices such as Redundant Array of Independent Disks (RAID) drives, solid state memory devices (e.g., USB memory, solid state drives (SSD) and any other type of storage media suitable for storing information. In the illustrated embodiment shown in FIG. 7, the system memory 706 can include non-volatile memory 710 and/or volatile memory 712. A basic input/output system (BIOS) can be stored in the non-volatile memory 710.

The computer 702 may include various types of computer-readable storage media in the form of one or more lower speed memory units, including an internal (or external) hard disk drive (HDD) 714, a magnetic floppy disk drive (FDD) 716 to read from or write to a removable magnetic disk 718, and an optical disk drive 720 to read from or write to a removable optical disk 722 (e.g., a CD-ROM or DVD). The HDD 714, FDD 716 and optical disk drive 720 can be connected to the system bus 708 by a HDD interface 724, an FDD interface 726 and an optical drive interface 728, respectively. The HDD interface 724 for external drive implementations can include at least one or both of Universal Serial Bus (USB) and IEEE 1394 interface technologies.

The drives and associated computer-readable media provide volatile and/or nonvolatile storage of data, data structures, computer-executable instructions, and so forth. For example, a number of program modules can be stored in the drives and memory units 710, 712, including an operating system 730, one or more application programs 732, other program modules 734, and program data 736. In one embodiment, the one or more application programs 732, other program modules 734, and program data 736 can include, for example, the various applications and/or components of the system 800.

A user can enter commands and information into the computer 702 through one or more wire/wireless input devices, for example, a keyboard 738 and a pointing device, such as a mouse 740. Other input devices may include microphones, infra-red (IR) remote controls, radio-frequency (RF) remote controls, game pads, stylus pens, card readers, dongles, finger print readers, gloves, graphics tablets, joysticks, keyboards, retina readers, touch screens (e.g., capacitive, resistive, etc.), trackballs, track pads, sensors, styluses, and the like. These and other input devices are often connected to the processor 704 through an input device interface 742 that is coupled to the system bus 708 but can be connected by other interfaces such as a parallel port, IEEE 1394 serial port, a game port, a USB port, an IR interface, and so forth.

A monitor 744 or other type of display device is also connected to the system bus 708 via an interface, such as a video adaptor 746. The monitor 744 may be internal or external to the computer 702. In addition to the monitor 744, a computer typically includes other peripheral output devices, such as speakers, printers, and so forth.

The computer 702 may operate in a networked environment using logical connections via wire and/or wireless communications to one or more remote computers, such as a remote computer 748. The remote computer 748 can be a workstation, a server computer, a router, a personal computer, portable computer, microprocessor-based entertainment appliance, a peer device or other common network node, and typically includes many or all the elements described relative to the computer 702, although, for purposes of brevity, only a memory/storage device 750 is illustrated. The logical connections depicted include wire/wireless connectivity to a local area network (LAN) 752 and/or larger networks, for example, a wide area network (WAN) 754. Such LAN and WAN networking environments are commonplace in offices and companies, and facilitate enterprise-wide computer networks, such as intranets, all of which may connect to a global communications network, for example, the Internet.

When used in a LAN networking environment, the computer 702 is connected to the LAN 752 through a wire and/or wireless communication network interface or adaptor 756. The adaptor 756 can facilitate wire and/or wireless communications to the LAN 752, which may also include a wireless access point disposed thereon for communicating with the wireless functionality of the adaptor 756.

When used in a WAN networking environment, the computer 702 can include a modem 758, or is connected to a communications server on the WAN 754 or has other means for establishing communications over the WAN 754, such as by way of the Internet. The modem 758, which can be internal or external and a wire and/or wireless device, connects to the system bus 708 via the input device interface 742. In a networked environment, program modules depicted relative to the computer 702, or portions thereof, can be stored in the remote memory/storage device 750. It will be appreciated that the network connections shown are exemplary and other means of establishing a communications link between the computers can be used.

The computer 702 is operable to communicate with wire and wireless devices or entities using the IEEE 802 family of standards, such as wireless devices operatively disposed in wireless communication (e.g., IEEE 802.11 over-the-air modulation techniques). This includes at least Wi-Fi (or Wireless Fidelity), WiMax, and Bluetooth™ wireless technologies, among others. Thus, the communication can be a predefined structure as with a conventional network or simply an ad hoc communication between at least two devices. Wi-Fi networks use radio technologies called IEEE 802.118 (a, b, g, n, etc.) to provide secure, reliable, fast wireless connectivity. A Wi-Fi network can be used to connect computers to each other, to the Internet, and to wire networks (which use IEEE 802.3-related media and functions).

The various elements of the devices as previously described with reference to FIGS. 1-6 may include various hardware elements, software elements, or a combination of both. Examples of hardware elements may include devices, logic devices, components, processors, microprocessors, circuits, processors, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. However, determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Figure 8:
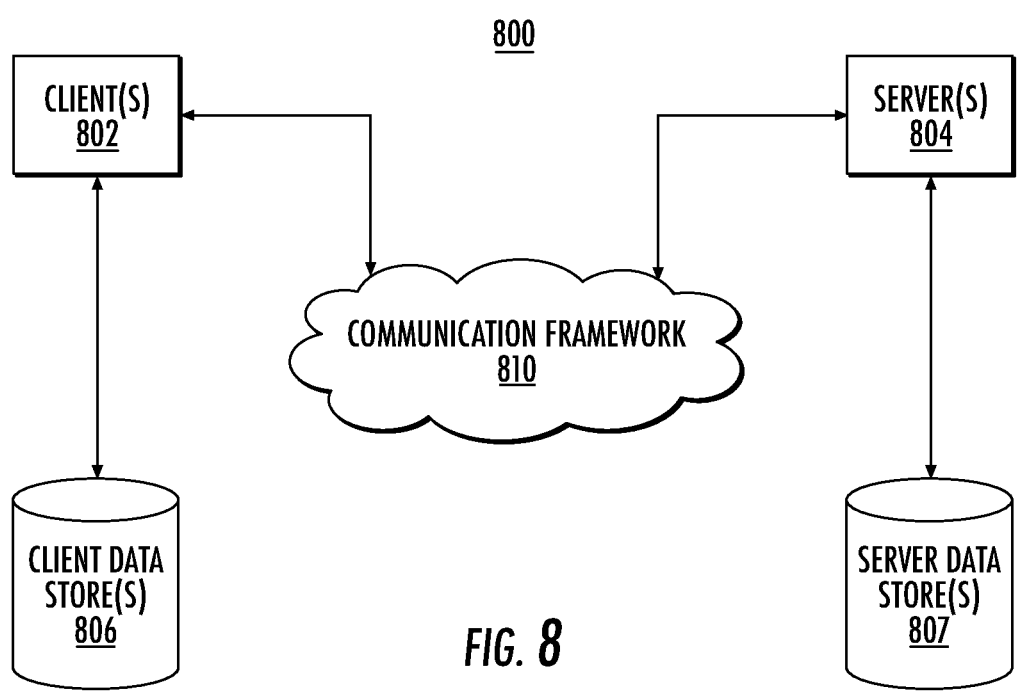
FIG. 8 illustrates an example communications architecture in accordance with one or more embodiments.

FIG. 8 is a block diagram depicting an exemplary communications architecture 800 suitable for implementing various embodiments. For example, one or more computing devices may communicate with each other via a communications framework, such as a network. At least a first computing device connected to the network may be a computer vision device. At least a second computing device connected to the network may be a different computer vision device. In examples, the first and second computing devices may be part of a larger computer vision system or network.

The communications architecture 800 includes various common communications elements, such as a transmitter, receiver, transceiver, radio, network interface, baseband processor, antenna, amplifiers, filters, power supplies, and so forth. The embodiments, however, are not limited to implementation by the communications architecture 800.

As shown in FIG. 8, the communications architecture 800 includes one or more clients 802 and servers 804. The one or more clients 802 and the servers 804 are operatively connected to one or more respective client data stores 806 and server data stores 807 that can be employed to store information local to the respective clients 802 and servers 804, such as cookies and/or associated contextual information.

The clients 802 and the servers 804 may communicate information between each other using a communication framework 810. The communications framework 810 may implement any well-known communications techniques and protocols. The communications framework 810 may be implemented as a packet-switched network (e.g., public networks such as the Internet, private networks such as an enterprise intranet, and so forth), a circuit-switched network (e.g., the public switched telephone network), or a combination of a packet-switched network and a circuit-switched network (with suitable gateways and translators).

The communications framework 810 may implement various network interfaces arranged to accept, communicate, and connect to a communications network. A network interface may be regarded as a specialized form of an input/output (I/O) interface. Network interfaces may employ connection protocols including without limitation direct connect, Ethernet (e.g., thick, thin, twisted pair 10/100/1000 Base T, and the like), token ring, wireless network interfaces, cellular network interfaces, IEEE 802.7a-x network interfaces, IEEE 802.16 network interfaces, IEEE 802.20 network interfaces, and the like. Further, multiple network interfaces may be used to engage with various communications network types. For example, multiple network interfaces may be employed to allow for the communication over broadcast, multicast, and unicast networks. Should processing requirements dictate a greater amount speed and capacity, distributed network controller architectures may similarly be employed to pool, load balance, and otherwise increase the communicative bandwidth required by clients 802 and the servers 804. A communications network may be any one and the combination of wired and/or wireless networks including without limitation a direct interconnection, a secured custom connection, a private network (e.g., an enterprise intranet), a public network (e.g., the Internet), a Personal Area Network (PAN), a Local Area Network (LAN), a Metropolitan Area Network (MAN), an Operating Missions as Nodes on the Internet (OMNI), a Wide Area Network (WAN), a wireless network, a cellular network, and other communications networks.

The components and features of the devices described above may be implemented using any combination of discrete circuitry, application specific integrated circuits (ASICs), logic gates and/or single chip architectures. Further, the features of the devices may be implemented using microcontrollers, programmable logic arrays and/or microprocessors or any combination of the foregoing where suitably appropriate. It is noted that hardware, firmware and/or software elements may be collectively or individually referred to herein as "logic" or "circuit."

At least one computer-readable storage medium may include instructions that, when executed, cause a system to perform any of the computer-implemented methods described herein.

Some embodiments may be described using the expression "one embodiment" or "an embodiment" along with their derivatives. These terms mean that a particular feature, structure, or characteristic described in connection with the embodiment is included in at least one embodiment. The appearances of the phrase "in one embodiment" in various places in the specification are not necessarily all referring to the same embodiment. Moreover, unless otherwise noted the features described above are recognized to be usable together in any combination. Thus, any features discussed separately may be employed in combination with each other unless it is noted that the features are incompatible with each other.

With general reference to notations and nomenclature used herein, the detailed descriptions herein may be presented in terms of program procedures executed on a computer or network of computers. These procedural descriptions and representations are used by those skilled in the art to most effectively convey the substance of their work to others skilled in the art.

A procedure is here, and generally, conceived to be a self-consistent sequence of operations leading to a desired result. These operations are those requiring physical manipulations of physical quantities. Usually, though not necessarily, these quantities take the form of electrical, magnetic or optical signals capable of being stored, transferred, combined, compared, and otherwise manipulated. It proves convenient at times, principally for reasons of common usage, to refer to these signals as bits, values, elements, symbols, characters, terms, numbers, or the like. It should be noted, however, that all of these and similar terms are to be associated with the appropriate physical quantities and are merely convenient labels applied to those quantities.

Further, the manipulations performed are often referred to in terms, such as adding or comparing, which are commonly associated with mental operations performed by a human operator. No such capability of a human operator is necessary, or desirable in most cases, in any of the operations described herein, which form part of one or more embodiments. Rather, the operations are machine operations.

Some embodiments may be described using the expression "coupled" and "connected" along with their derivatives. These terms are not necessarily intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

Various embodiments also relate to apparatus or systems for performing these operations. This apparatus may be specially constructed for the required purpose and may be selectively activated or reconfigured by a computer program stored in the computer. The procedures presented herein are not inherently related to a particular computer or other apparatus. The required structure for a variety of these machines will appear from the description given.

It is emphasized that the Abstract of the Disclosure is provided to allow a reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

What has been described above includes examples of the disclosed architecture. It is, of course, not possible to describe every conceivable combination of components and/or methodologies, but one of ordinary skill in the art may recognize that many further combinations and permutations are possible. Accordingly, the novel architecture is intended to embrace all such alterations, modifications and variations that fall within the spirit and scope of the appended claims.

What is claimed is:

1. A system comprising:
   an apparatus, wherein the apparatus comprises:
      a magnetometer;
      a visual marker; and
      memory storing executable instructions;
      processing circuitry, coupled with the memory, operable to execute the instructions, that when executed, cause the processing circuitry to:
         measure, via the magnetometer, a first magnetic field strength at a first position relative to an object;
         measure, via the magnetometer, a second magnetic field strength at a second position relative to the object; and
         provide the first and second magnetic field strength measurements to at least one computing device;
   the at least one computing device, wherein the at least one computing device comprises:
      one or more cameras;
      memory storing executable instructions;
      processing circuitry, coupled with the memory, operating to execute the instructions, that when executed, cause the processing circuitry to:
         capture an image of the object via the one or more cameras;
         track, via the one or more cameras, the visual marker when the first magnetic field strength is measured at the first position;
         receive the first magnetic field strength measurement from the apparatus;
         track, via the one or more cameras, the visual marker when the second magnetic field strength is measured at the second position;
         receive the second magnetic field strength measurement from the apparatus; and
         generate a heat map of the object based at least on the received first and second magnetic field strength measurements, and
      wherein the heat map visually indicates the first and second magnetic field strengths on the image of the object.

2. The system of claim 1, wherein the processing circuitry of the apparatus is further caused to:
   measure a third magnetic field strength at a third position relative to the object; and
   provide the third magnetic field strength measurement to the at least one computing device.

3. The system of claim 2, wherein the processing circuitry of the at least one computing device is further caused to:
   track the visual marker when the third magnetic field strength is measured at the third position;
   receive the third magnetic field strength measurement from the apparatus; and
   generate the heat map of the object based at least on the received third magnetic field strength measurement.

4. The system of claim 1, wherein the object is one or more of the following: (i) a smartphone, (ii) a laptop, (iii) a tablet computing device, (iv) a wearable computing device, and (v) a mobile computing device.

5. The system of claim 1, wherein the visual marker is arranged on the magnetometer.

6. The system of claim 5, wherein the visual marker is a shape, a color, a colored shape, a dot, a colored dot, a visual pattern, and/or a machine-readable code.

7. The system of claim 1, wherein the at least one computing device is a computer vision device.

8. The system of claim 7, wherein a source of the first and second magnetic field strengths is an NFC reader coil.

9. The system of claim 1, the processing circuitry of the apparatus is further configured to:

determine a source of the first magnetic field and/or the second magnetic field based on one or more signal frequencies from the source; and provide the source to the at least one computing device.

10. The system of claim 9, wherein the at least one computing device is configured to selectively display and color-code the source of the first magnetic field and/or the second magnetic field.

11. The system of claim 1, wherein the apparatus has a wand-like shape.

12. An apparatus comprising:

one or more cameras;

memory storing executable instructions; and processing circuitry, coupled with the memory, operable to execute the instructions, that when executed, cause the processing circuitry to:

detect, via the one or more cameras, a visual marker at a first position relative to an object;

receive a first magnetic field strength measurement corresponding to a first magnetic field strength at the first position;

detect, via the one or more cameras, the visual marker at a second position relative to the object;

receive a second magnetic field strength measurement corresponding to a second magnetic field strength at the second position; and generate a heat map of the object based at least in part on the received first and second magnetic field strength measurements, and wherein the heat map visually indicates the first and second magnetic field strengths on an image of the object.

13. The apparatus of claim 12, wherein the first and second magnetic field strengths are measured by a sensor, the sensor being a hall effect sensor or a coil.

14. The apparatus of claim 13, wherein the visual marker is arranged or placed on the sensor.

15. A method comprising:

measuring, via a magnetometer, a first magnetic field strength at a first position relative to an object;

measuring, via the magnetometer, a second magnetic field strength at a second position relative to the object;

providing the first and second magnetic field strength measurements to at least one computing device;

capturing, via the at least one computing device, an image of the object via the one or more cameras;

tracking, via one or more cameras, a visual marker when the first magnetic field strength is measured at the first position and when the second magnetic field is measured at the second position;

receiving, via the at least one computing device, the first and second magnetic field strength measurements; and generating, via the at least one computing device, a magnetic heat map of the object based at least on the received first and second magnetic field strength measurements, and wherein the magnetic heat map visually indicates the first and second magnetic field strengths on the image of the object.

16. The method of claim 15, wherein the object is one or more of the following: (i) a smartphone, (ii) a laptop, (iii) a tablet computing device, (iv) a wearable computing device, and (v) a mobile computing device.

17. The method of claim 15, wherein the visual marker is arranged on the magnetometer.

18. The method of claim 15, wherein the at least one computing device is a computer vision device.

* * * * *